(12) United States Patent
Itoh et al.

(10) Patent No.: US 7,431,792 B2
(45) Date of Patent: Oct. 7, 2008

(54) METHOD AND APPARATUS FOR PLACING CONDUCTIVE BALLS

(75) Inventors: Motoyuki Itoh, Tokyo (JP); Masanori Ochiai, Tokyo (JP); Shinichi Kazui, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 227 days.

(21) Appl. No.: 10/547,905

(22) PCT Filed: Mar. 8, 2004

(86) PCT No.: PCT/JP2004/002968

§ 371 (c)(1),
(2), (4) Date: Sep. 6, 2005

(87) PCT Pub. No.: WO2004/082346

PCT Pub. Date: Sep. 23, 2004

(65) Prior Publication Data

US 2006/0086777 A1    Apr. 27, 2006

(30) Foreign Application Priority Data

| Mar. 10, 2003 | (JP) | 2003-063058 |
| Apr. 10, 2003 | (JP) | 2003-106519 |
| Apr. 22, 2003 | (JP) | 2003-117077 |
| Jun. 2, 2003 | (JP) | 2003-157078 |
| Jun. 20, 2003 | (JP) | 2003-177098 |
| Sep. 3, 2003 | (JP) | 2003-311766 |

(51) Int. Cl.
*B32B 15/00* (2006.01)

(52) U.S. Cl. .................. 156/279; 228/245; 228/246

(58) Field of Classification Search ........... None
See application file for complete search history.

(56) References Cited

U.S. PATENT DOCUMENTS

| 3,665,856 | A | * | 5/1972 | Heller, Jr. | .................... | 101/129 |
| 4,441,228 | A | * | 4/1984 | Marquart et al. | .......... | 15/229.8 |
| 6,213,386 | B1 | * | 4/2001 | Inoue et al. | ................. | 228/245 |
| 6,622,773 | B2 | * | 9/2003 | Farnworth | .................... | 164/80 |
| 2003/0127501 | A1 | * | 7/2003 | Cheng et al. | ................. | 228/246 |
| 2003/0201309 | A1 | * | 10/2003 | Grigg et al. | ................. | 228/207 |

FOREIGN PATENT DOCUMENTS

JP    07-156363    6/1995

(Continued)

*Primary Examiner*—Philip C Tucker
*Assistant Examiner*—Kimberly K McClelland
(74) *Attorney, Agent, or Firm*—J.C. Patents

(57) ABSTRACT

Improved placing method and apparatus are provided for placing conductive balls in a predetermined pattern onto one surface of a base unit. An arrangement member is provided to have one surface, another surface opposite to the one surface of the arrangement member and positioning openings The positioning openings are arranged corresponding to the pattern so that the balls are inserted therein. The another surface of the arrangement member is opposite to the one surface of the base unit. The arrangement member has two or more line members whose core axes are substantially aligned. The transfer device is arranged so that the line members are substantially in a horizontal position to contact with the balls, and then the transfer device is horizontally moved with respect to the one surface of the arrangement member. Then, the balls are placed on the one surface of the base unit through the positioning openings.

15 Claims, 21 Drawing Sheets

FOREIGN PATENT DOCUMENTS

| | | |
|---|---|---|
| JP | 08-236916 | 9/1996 |
| JP | 09-162533 | 6/1997 |
| JP | 09-293753 | 11/1997 |
| JP | 10-126046 | 5/1998 |
| JP | 11-243274 | 9/1999 |
| JP | 2000-049183 | 2/2000 |
| JP | 2001-118496 | 4/2001 |
| JP | 2001-223234 | 8/2001 |
| JP | 2001-244288 | 9/2001 |
| JP | 2001-267731 | 9/2001 |
| JP | 2002-151539 | 5/2002 |
| JP | 2002-171054 | 6/2002 |

* cited by examiner (a)

(b)

(a)

(b)

(a)

(b)

(c)

(d)

(e)

(a)

(b)

METHOD AND APPARATUS FOR PLACING CONDUCTIVE BALLS

BACKGROUND OF THE INVENTION

1. Field of the Invention

This invention relates a placing method and a placing apparatus for placing balls with conductivity that are arranged in a predetermined pattern on a base unit, such as electronic parts or parts used for fabricating electronic parts etc.

2. Background Technology

Electronic parts like semiconductor devices, substrates or packages thereof with protruded connection bumps of area array type, such as BGA (Ball Grid Array) type and FC (Flip-Chip) type, etc., can be examples of the base unit. On the base unit, balls with conductivity (conductive balls, hereinafter) are placed in a predetermined pattern.

In recent years, as the portable machines and notebook computers progress in the direction of high speed, high performance, lightweight, small-size and thin shape, the performances of a large-dimension device and multiple terminals are required for the built-in electronic components. In responding to such requirements, the electronic components are adopted with the above area array type.

Methods for using a conductive material, such as a solder or copper, etc. to form connection bumps include a pasting method for printing paste, such as conductive material onto electrodes of the electronic components; conductive ball method for placing conductive balls on electrodes; and film attaching method for plating or depositing conductive material, etc. Due to trend of forming multiple terminals, the density of electrodes becomes high and the size of the connection bumps becomes correspondingly smaller. When forming small-size connection bumps, the conductive ball method is adapted for many cases because the conductive ball method is advantageous in alignment accuracy and productivity for the connection bumps.

According to the conventional conductive ball method, the connection bumps are formed by the following processes: a printing process for printing adhesive auxiliary such as solder paste or flux onto electrodes; a placing process for placing conductive balls onto the electrodes where the adhesive auxiliary has been printed; and a bump forming process for heating the conductive balls to form the connection bumps.

For the placing process, one way to place the conductive balls onto the electrodes, for example, is disclosed in Japanese Laid Open Publication 2001-223234 (Patent Document 1). As described in the publication, the method is based upon a suction mechanism such that the solder balls are held by a suction head using negative pressure and are transported to the electrodes to be placed thereon. However, the conductive balls might be deformed due to the suction force of the suction head. In addition, the conductive balls are held by the flux attached on the suction head, so that the conductive balls are not separated from the suction head even though the suction force is released. Therefore, an improper placement of the conductive balls may occur. Furthermore, the conductive solder balls moving in the air by the suction head will carry electrostatic charges. The collection of the solder balls aggregated by the electrostatic charges is placed on the electrodes, while the remaining solder balls (remaining balls or extra balls) may still be held onto the surface of the workpiece rather than the electrodes. This problem will be particularly obvious as the diameter of the conductive balls becomes smaller and smaller.

An alternative method for placing conductive balls is the so-called transfer method. In the transfer method, a plate-shaped mask is used as an arrangement member where throughhole-like positioning openings corresponding to the pattern of the electrodes are formed. The conductive balls supplied to the mask are loaded into the positioning openings (this operation is known as transfer), and are placed onto the electrodes through the positioning openings. One example of the transfer method is disclosed in Japanese Laid Open Publication No. 2002-171054 (patent document 2), Japanese Laid Open Publication No. H09-162533 (patent document 3), Japanese Laid Open Publication No. 2001-267731 (patent document 4) and Japanese Laid Open Publication No. H10-126046 (patent document 5).

The patent document 2 discloses a solder ball placement device for placing solder balls on fluxes that are applied to a plurality of locations on a workpiece surface. The solder ball placement device comprises a mask, a tilting mechanism and a restriction member. The mask is used to cover the workpiece and the mask has a plurality of ball-holding holes at positions corresponding to the positions of the plurality of fluxes, where the solder balls are capable of passing through these ball-holding holes. The tilting mechanism is used for tilting the workpiece and the mask. The restriction member is used to restrict the moving speed of the plurality of solder balls that moves from an upside to a downside on the surface of the mask in order for the solder balls to fall into the positioning openings. The falling conductive balls are restricted by the restriction member, and can be loaded into the positioning openings by moving the conductive balls at a proper speed.

The patent document 3 discloses a placement device, in which the bottom of a solder-supplying head is in contact with a solder-supplied object where the solder is to be supplied thereon. A solder-supplying unit is slid on the inner surface of the bottom of the solder-supplying head. A plurality of spherical solders previously supplied to the solder-supplying head is advanced to the inner surface of the bottom of the solder-supplying head. In this way, through the respective solder supplying holes, the spherical solders are respectively supplied to each of the solder positions of the solder-supplied object. A discharging brush is used as a transfer device (i.e., a solder supplying unit), and by sliding the erect front ends of the discharging brush, the conductive balls are respectively supplied to each of the solder positions of the solder-supplied object.

The patent document 4 discloses a placement method. The placement method comprises an adhesive film forming process for selectively forming adhesive films on the respective electrodes on an electronic component; a joint material arranging and supplying process for arranging and supplying a joint material on the respective adhesive films formed in the adhesive film forming process; and an affixing process for melting the joint material supplied in the joint material arranging and supplying process and then affixed to the electrodes. A ball arranging mask, i.e., an arrangement member, is disposed on a wafer. The solder balls are supplied onto the ball arranging mask. The solder balls are transported by dispensing device (i.e., a transfer device) and are placed on the electrodes on which the adhesive films are formed.

The patent document 5 discloses a placement device for placing tiny solder balls on a pattern formed on a substrate in a ball grid array device and a holding stage for holding the substrate. A mask having guiding holes corresponding to the pattern on the substrate for the solder balls is disposed above the substrate. A spacer is formed between the mask and the substrate. A blade capable of horizontally moving is disposed over the upper surface of the mask. Solder balls are disposed on the upper surface of the mask. Then, one by one, the solder balls fall into the guiding holes of the mask by the horizontally moving the flexible blade. The solder balls are scraped to be collected at one side of the mask, and only the required portions of the mask are placed with the solder balls.

In the transfer method, since the conductive balls are placed by gravity, it is advantageous that the problems occurred in the suction method can be solved. In addition, due to the restriction of the size of the position opening, the collection of the aggregated conductive balls is not placed on the electrodes even though the conductive balls are charged. Since the portions other than the electrodes are blocked by the mask, the remaining balls will not be placed on the undesired portions.

[Patent Document 1] Japanese Laid Open Publication 2001-223234

[Patent Document 2] Japanese Laid Open Publication 2002-171054

[Patent Document 3] Japanese Laid Open Publication He9-162533

[Patent Document 4] Japanese Laid Open Publication 2001-267731

[Patent Document 5] Japanese Laid Open Publication He10-126046

Nowadays, the electronic components are required to have more terminals and be smaller in size. In this case, the number of the connection bumps increases tremendously, while the pitch becomes smaller and the density becomes higher. The diameter of the conductive ball has to be reduced to 100 µm or less. However, problems occur when the diameter of the conductive balls becomes smaller.

Regarding the transfer method, if the diameter of the conductive ball is small, the rate to fill the positioning opening decreases. Therefore, a portion of the electrodes is not placed with the conductive balls. Thus, the placement ratio is possibly reduced. The placement ratio is defined with the following formula: number of conductive balls placed on predetermined positions/number of predetermined positions to be placed. Specifically, for example, when the base unit has a plurality of electrodes, the placement ratio is defined as follow: the number of conductive balls placed on the electrodes/the number of the electrodes.

When the diameter and the mass of the conductive balls are large, the conductive balls that are loaded into the positioning openings fall with sufficient energy by their own weight to impact with the flux. The conductive balls are placed on the electrodes and are firmly adhered to the flux. The contact area between the large-diameter conductive ball and the flux is large. Therefore, the conductive balls that are firmly adhered and held by the flux are seldom separated from the electrodes even though they are being subjected to external forces.

However, if the conductive balls are small in diameter and mass, the conductive balls that are loaded into the positioning openings fall with small energy to impact with the flux. Further, the contact area with the flux also becomes smaller. As a result, the adhesive force between the conductive balls and the flux is small. Thus the conductive balls are easily separated from the electrodes even though they are only subjected to a small external force. For example, when a flexible dispenser is used as the transfer device to transfer the conductive balls to the positioning openings, the front end of the dispenser is disposed inside a portion of the positioning openings, and the conductive balls are scraped out by the front end to separate from the electrodes. Therefore, the placement ratio for the conductive balls reduces.

As the diameter becomes smaller, the conductive ball behaves like powders. Therefore, the domination of the inertial force (gravity) becomes relatively small. For example, since the electronic components are manufactured in an atmospheric environment, a portion of the mask used as the arrangement member will carry electrostatic charges or adhered with moisture. When the conductive balls are large in diameter and mass, the inertial force (gravity) dominates. When the conductive balls are transferred by the dispenser over the mask or the conductive balls are loaded into the positioning openings, the moving conductive balls have sufficient inertial force (gravity). Therefore, as described above, the adhesion of conductive balls to a portion of the mask due to electrostatic charges or water seldom occurs.

As the diameter and the mass of the conductive ball become smaller, the magnitude of the adhesive force due to static electricity or moisture would become large when compared with the inertia force (gravity). Therefore, as the conductive balls are adhered at the positioning openings by the suction force, conductive balls are not properly placed on the electrodes. As a result, the placement ratio reduces. In addition, as the conductive balls are adhered on the surface of the mask, the placement ratio of the conductive balls by a single dispensing operation is low. As a result, a plurality of transfer operations has to be performed. However, the plurality of transfer operations will promote a phenomenon in which the conductive balls filled in the positioning openings are scraped out by the front end of the dispenser. Therefore, it is difficult to improve the placement ratio. Furthermore, the conductive balls adhered to the mask might remain adhered to the mask. When removing the mask from the electronic component, the conductive balls adhered to the mask will be separated from the mask, which is the reason of short-circuit of the conductor circuits.

As shown in FIG. 20(a), the electronic parts has unavoidable deformations, such as curve and variation of the thickness, caused by the difference of the expansion rate between the electronic parts 7 and the electrodes 71 or due to the conductor pattern or the manufacturing conditions, etc. As the mask 92 is arranged one the electronic component 7, a gap between the electronic component 7 and the mask 92 is created. When the gap is larger than the conductive ball, the conductive balls loaded in the positioning openings 921 will escape through the gap and fail to be placed on the electrodes 71. As a result, the placement ratio reduces. In addition, the escaped conductive balls become redundant conductive balls, causing a short circuit of the conductive pattern. In addition, the escaped conductive balls may adhere onto the peripherals of the electrodes 71 and the plural of conductive balls may link to form a bridge.

When the mask is positioned on the electronic component, the flux being applied on the electrodes may adhere on the inner walls of the positioning openings. The conductive balls loaded into the positioning openings are captured by the flux attached on the inner walls. As a result, the placement ratio reduces. In addition, there might be a case that the flux is adhered on the mask and the mask can not be separated from the electronic component.

Regarding with the transfer method, the conductive balls which are more than the number of the electrodes are supplied to the upper surface of the mask to perform the transfer operation, and the redundant conductive balls that are not filled in the positioning openings are recycled. In most cases, the recycled conductive balls are used for the next transfer operation. During performance of the transfer operation, the flux might be adhered on the conductive balls. The conductive balls on which the flux is adhered can not be smoothly loaded into the positioning openings. As a result, the placement ratio reduces. Regarding with the flux issue, it can be solved by cleaning the mask and the conductive balls, but the manufacturing cost will increase.

SUMMARY OF THE INVENTION

The object of the present invention is to provide an improved placing method and placing apparatus for placing conductive balls in a predetermined pattern onto a base unit where the conductive balls are arranged thereon. One object of the present invention is to provide a placing method and a placing apparatus for conductive balls, which is capable of improving the placement ratio of the conductive balls on the base unit. Another object of the present invention is to provide a placing method and a placing apparatus, in which the remaining balls are difficult to be adhered on the base unit.

The present invention provides a placing method and a placing apparatus, in which balls with conductivity are placed in a predetermined pattern onto one surface of a base unit.

In addition, conductive balls of the present invention include using metal as the main material, such as Sn, Cu, Au, Ag, W, Ni, Mo, AL, etc. Moreover, the present invention also includes conductive balls, in which resins such as polypropylene, polyvinyl chloride, polystyrene, polyamide, acetylcellulose, polyester, etc., are used as the main material with a conductive metal (such as solder) coated on the surface of the ball.

The base unit of the present invention includes electronic components using conductive balls as the connection bumps, such as semiconductor devices (chips), substrates and their packages, and other electronic components other than chips, substrates and their packages. In addition, parts for forming the connection bumps on the electronic component, such as parts where the conductive balls are arranged for placing the conductive balls on the electronic parts, are also included as the base unit of the present invention.

In the present invention, the shape of the surface of the base unit on which the conductive balls are placed is not particularly limited. The shape of the surface of the base unit can be planar, curve, concave or convex, etc.

In one embodiment of the present invention, the invention provides a method for placing balls having conductivity in a predetermined pattern onto one surface of a base unit, wherein the method includes a first step and a second step. In the first step, an arrangement member having one surface, another surface and positioning openings is positioned in a manner that the another surface of the arrangement member is opposite to the one surface of the base unit, wherein the another surface of the arrangement member is opposite to the one surface of the arrangement member, and the positioning openings are arranged corresponding to a pattern such that the openings are through from the one surface to the another surface of the base unit for allowing the balls to inserted therein. In the second step, a transfer device is moved horizontally with respect to the one surface of the arrangement member and the balls are placed on the one surface of the base unit through the positioning openings, wherein the transfer device has two or more line members of which the core axes are substantially aligned, and the line members are arranged in a substantially horizontal manner capable of being in contact with the balls supplied to the one surface of the arrangement member.

According to the invention, the arrangement member is positioned in a manner that the another surface of the arrangement member is opposite to the one surface of the base unit, wherein the arrangement member has one surface, another surface opposite to the one surface and positioning openings, and the positioning openings are arranged corresponding to a pattern in which the openings are through from one surface to the another surface of the arrangement member for allowing the balls to insert therein. The transfer device moves horizontally with respect to the one surface of the arrangement member, wherein with respect to the arrangement member positioned in the above manner, the transfer device has two or more line members of which the core axes are substantially aligned. The line members are arranged in a substantially horizontal manner with respect to the balls supplied to the one surface of the arrangement member. By the horizontal movement of the transfer device, the balls are captured and moved by the line members and are loaded into the positioning openings. On the other hand, the line member of the transfer device is maintained in a manner that their core axes are parallel with the one surface of the arrangement member, and thus are moved horizontally. Therefore, it is difficult for the line members to enter into the positioning openings. The balls, which are loaded into the positioning openings and placed on the base unit, are seldom being scraped out by the line members.

In the above invention, the placing method preferably comprises a step for drawing the arrangement member to the one surface side of the base unit in the second step. According to the invention, the arrangement member is positioned in a manner that the another surface of the arrangement member is opposite to the one surface of the base unit and is drawn to the one surface side of the base unit. The arrangement member has one surface, another surface opposite to the one surface and positioning openings, and the positioning openings are arranged corresponding to a pattern in which the openings are opened to the one and the another surfaces of the arrangement member so that the balls are inserted therein. As a result, the another surface of the arrangement member and the one surface of the base unit are closely attached. With this configuration, the balls are supplied to the one surface of the arrangement member, and the balls are placed on the one surface of the base unit through the positioning openings. Since the arrangement member and the base unit are closely attached, the balls are kept at the disposed positions and can not be escaped from the arrangement member.

In the invention, the placing method preferably comprises a third step, wherein a low-adhesive temporal fixing film is formed on the one surface of the base unit, and an adhesive strength of the temporal fixing film is increased after the second step. According to the invention, the balls are placed via the temporal fixing film onto the one surface of the base unit on which the low-adhesive temporal fixing film is formed. Since the adhesive strength of the temporal fixing film where the balls are placed is low, the chances that the temporal fixing film is adhered to the arrangement member or the ball themselves are low. The balls are temporally secured on the base unit by the temporal fixing film in which the adhesive strength is increased. Therefore, it is infrequent that the balls that are only temporally secured are easily separated from the base unit even though they are being subjected to an external force.

In the above invention, the placing method preferably comprises a step for forming a low-adhesive temporal fixing film on the one surface of the base unit before the first step; and a third step for increasing an adhesive strength of the temporal fixing film after the second step. According to the invention, the low-adhesive temporal fixing film is formed on the one surface of the base unit. The balls are placed via the temporal fixing film onto the one surface of the base unit on which the low-adhesive temporal fixing film is formed. Since the adhesive strength of the temporal fixing film where the balls are placed is low, the chances that the temporal fixing film is adhered on the arrangement member (such as a mask or a suction head) for placing the balls or the ball themselves are low. In addition, the disposed balls are temporally fixed on the base unit by the temporal fixing film in which the adhesive strength is increased. Therefore, it is seldom that the balls that are temporally fixed are easily separated from the base unit even though they are being subjected to external forces.

In another embodiment of the present invention, the invention provides an apparatus for placing balls having conductivity in a predetermined pattern on one surface of a base unit. The placing apparatus comprises an arrangement member, having one surface, another surface opposite to the one surface and positioning openings, wherein the positioning openings are arranged corresponding to a pattern such that the openings are through from the one surface to the another surface of the arrangement member allowing the balls to insert therein. The placing apparatus also comprises a transfer device, having two or more line members of which the core axes are substantially aligned. When placing the balls, the arrangement member is positioned in a manner that the another surface of the arrangement member is opposite to the one surface of the base unit. In addition, the line members of the transfer device are arranged in a substantially horizontal manner to contact with the balls supplied to the one surface of the arrangement member, and the transfer device is horizontally moved with respect to the one surface of the arrangement member.

According to the invention, when placing the balls, the arrangement member is positioned in a manner that the another surface of the arrangement member is opposite to the one surface of the base unit, wherein the arrangement member has one surface, another surface opposite to the one surface and positioning openings, and the positioning openings are arranged corresponding to a pattern such that the openings are through from the one surface to the another surface of the arrangement member allowing the balls to insert therein. The line members are arranged in a substantially horizontal manner with respect to the balls supplied to the one surface of the arrangement member. The transfer device, having two or more line members of which the core axes are substantially aligned, is moved horizontally with respect to the one surface of the arrangement member. By the horizontal movement of the transfer device, the balls are captured and moved by the line members, and are loaded into the positioning openings. On the other hand, the line member of the transfer device is kept in a manner that their core axes are parallel with the one surface of the arrangement member, and thus is moved horizontally. Therefore, it is difficult for the line members to enter into the positioning openings. The balls, which are loaded into the positioning openings and are placed on the base unit, are seldom being scraped out by the line members.

In the above invention, when the another surface of the arrangement member is positioned opposite to the one surface of the base unit, a ratio of a distance t from the one surface of the base unit to the one surface of the arrangement member to a diameter d of the ball satisfies the condition of $0.8 \leq t/d \leq 1.4$. Preferably, the positioning opening has a first taper hole getting wider from the one surface to the another surface, and a crest line at the one surface side of the first taper hole is higher than the center of the ball placed on the one surface of the base unit. According to the invention, when the another surface of the arrangement member is positioned opposite to the one surface of the base unit, since a ratio of a distance t from the one surface of the base unit to the one surface of the arrangement member to a diameter d of the ball satisfies the condition of $0.8 \leq t/d \leq 1.4$, a plurality of balls will not be loaded into the positioning openings. In addition, each positioning opening has a first taper hole getting wider from the one surface to the another surface, and a crest line at the one surface side of the first taper hole is higher than the center of the ball placed on the one surface of the base unit. Therefore, even though an external force acts upon the balls that are loaded into the positioning openings and placed on the one surface of the base unit, the balls are restricted by the sidewalls of the first taper holes and difficult to be detached from the base unit.

In the above invention, the placement apparatus preferably comprises a pulling unit for drawing the arrangement member, wherein the pulling unit is arranged in a way that the base unit is in between the pulling unit and the arrangement member wherein the another surface of the arrangement member is positioned facing the one surface of the base unit. According to the invention, the another surface of the arrangement member is positioned facing the one surface of the base unit, wherein the arrangement member has one surface, another surface opposite to the one surface and positioning openings, and the positioning openings are arranged corresponding to a pattern such that the openings are through from the one surface and the another surface of the arrangement member allowing the balls to insert therein. In this way, the pulling unit for drawing the arrangement member is arranged with the base unit in between the arrangement member and the pulling unit. Therefore, the arrangement member is drawn to the one surface by the pulling unit, and is closely attached to the base unit. In this way, the balls are supplied to the one surface of the arrangement member, and the balls are placed on the one surface of the base unit through the positioning openings. Since the arrangement member and the base unit are closely attached, the balls will not escape from the arrangement member and are kept at the disposed positions.

In the above invention, the placement apparatus preferably comprises the base unit having a low-adhesive temporal fixing film formed on the one surface; and a temporal fixing film deteriorating unit for increasing the adhesive strength of the temporal fixing film. According to the invention, the balls are placed on the one surface of the base unit via the temporal fixing film by using the placement unit. The adhesive strength of the temporal fixing film is increased by the temporal fixing film deteriorating unit. Therefore, the balls are temporally secured.

In the above invention, the placement apparatus preferably comprises a temporal fixing film forming unit for forming a low-adhesive temporal fixing film on the one surface of the base unit; and a temporal fixing film deteriorating unit for increasing the adhesive strength of the temporal fixing film. According to the invention, the low-adhesive temporal fixing film is formed by the temporal fixing film forming unit on the one surface of the base unit. The balls are placed on the one surface of the base unit via the temporal fixing film by using the placement unit. The adhesive strength of the temporal fixing film is increased by the temporal fixing film deteriorating unit. Therefore, the balls are temporally fixed.

DESCRIPTION OF THE PREFERRED EMBODIMENT

The present invention is described as follows.

1. First Embodiment

One example of the present invention according to the first embodiment is described with reference to FIGS. 1 to 14.

Figure 1:
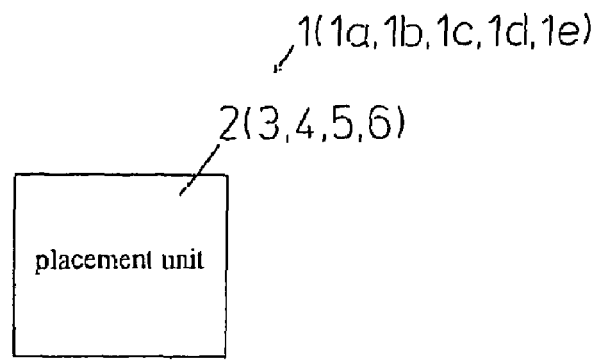
FIG. 1 is a concept diagram of placement apparatus according to the first to the sixth embodiments.

As shown in FIG. 1, the placement device 1a of the first embodiment comprises a placement unit 2 for arranging and placing solder balls onto a substrate, i.e., a base unit.

Figure 3:
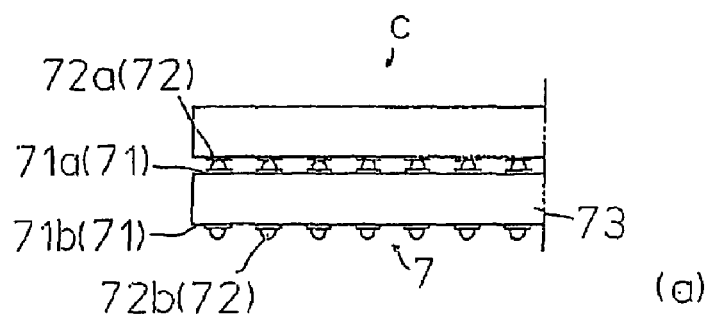
FIG. 3 shows a substrate structure where conductive balls are placed in the placement apparatus of the first embodiment.
Figure 3:
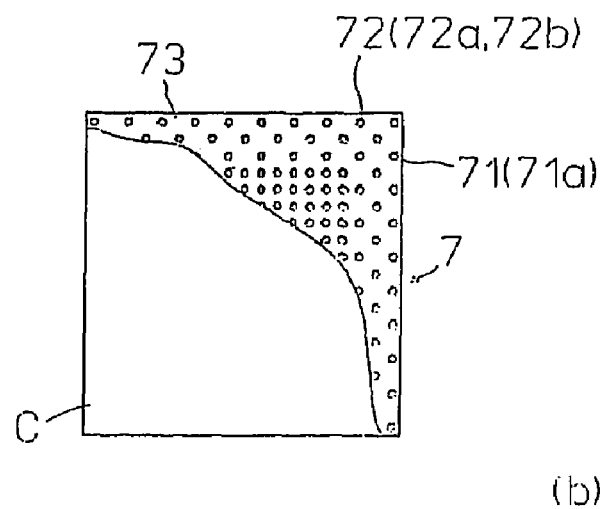

As shown in FIG. 3, connection bumps 72b (72), connected to an external device such as a motherboard, are protruded from one surface (lower surface) of the substrate 7 in an area array pattern, and connection bumps 72a (72), connected to a semiconductor element c, are protruded from another surface (upper surface) of the substrate 7 in an area array pattern. The semiconductor element c is bonded to the upper surface of the substrate 7 by a flip-chip bonding method, and a package is thus formed.

The substrate 7 has a thin-plate base substance 73, pot-shaped electrodes 71a (71) where the aforementioned connection bumps 72a are protruded form the upper surface of the base substance 73, and pot-shaped electrodes 71b (71) where the aforementioned connection bumps 72b are protruded form the lower surface. A conductive pattern for rewiring is formed on the surface and the inside of the base substance 73. According to the requirement, a well-known resin-based or ceramic-based base substance, or its laminated base substance, etc. can be selected to serve as the base substance 71.

Figure 2:
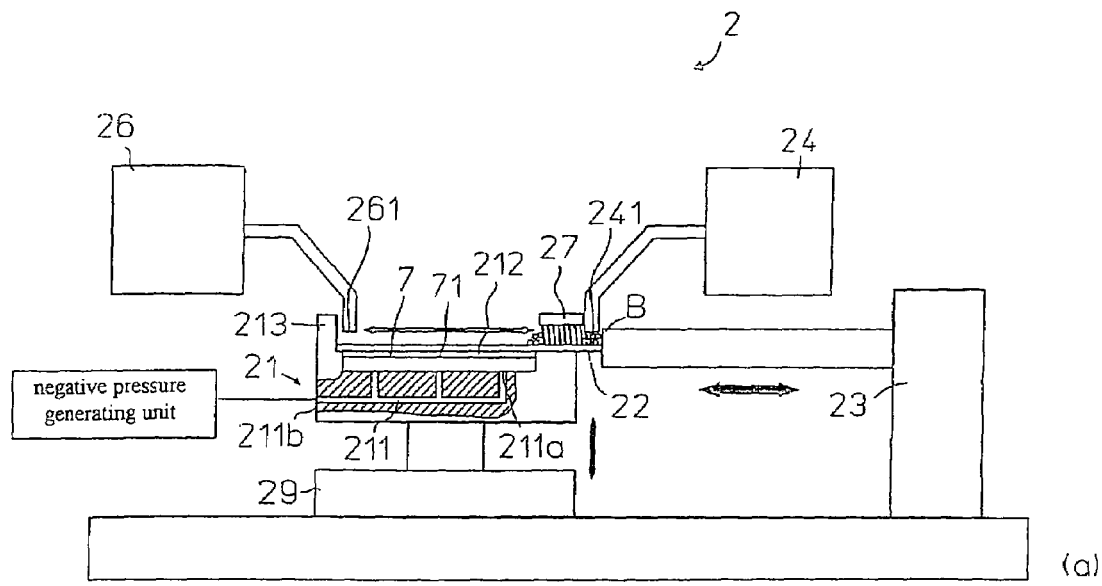
FIG. 2 is a side-viewed diagram of a placement unit according to the first embodiment.
Figure 2:
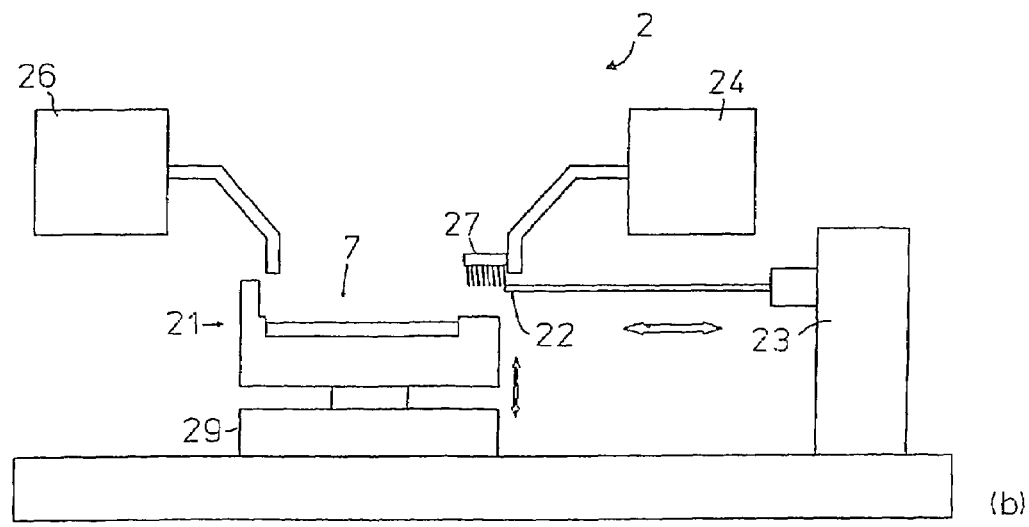
Figure 4:
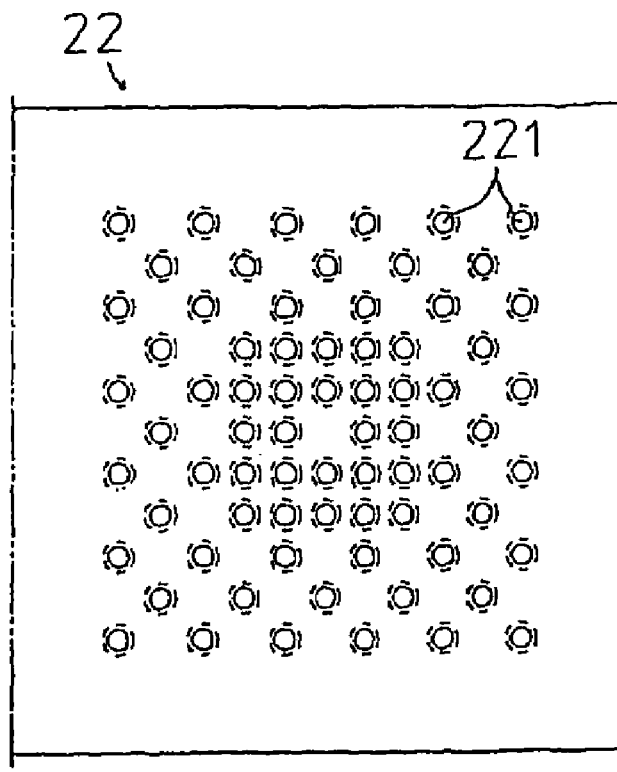
FIG. 4 shows an arrangement member of the placement unit in FIG. 2.
Figure 4:
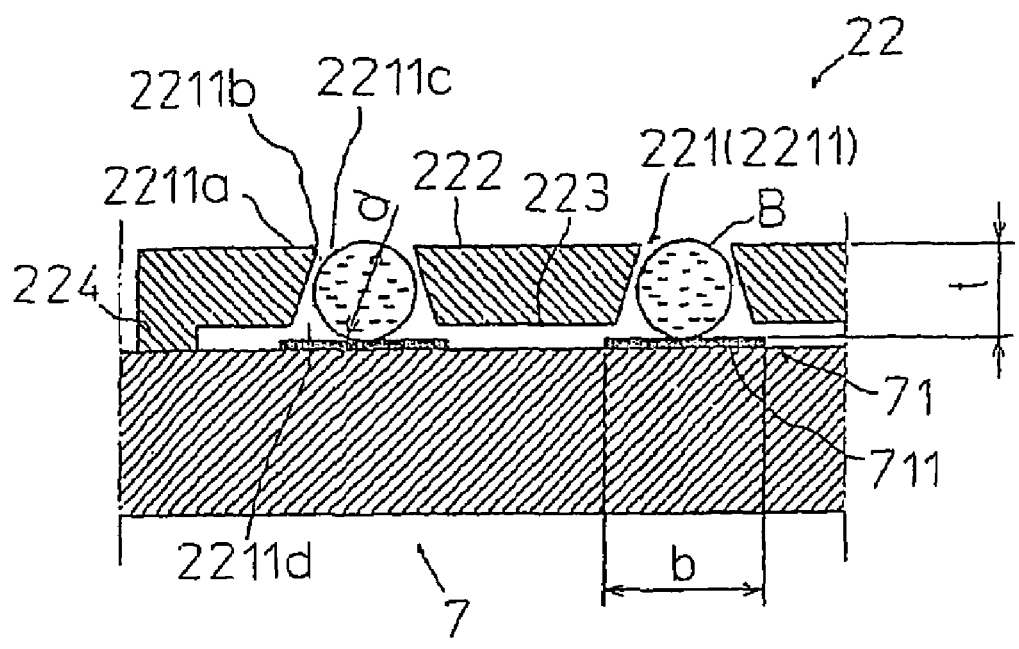

As shown in FIG. 2, the placement unit 2 comprises a mask 22 and a transfer device 27. The mask 22 is an arrangement member for arranging solder balls B on the electrodes 71 of the substrate 7. The transfer device 27 moves horizontally on the upper surface of the mask 22 positioned on the substrate by using a moving device (not shown) to transfer the solder balls B.

In the first embodiment, for automatization, the placement unit 2 comprises a holder 21, a holder raising unit 29, a mask horizontal moving unit 23, a ball supplying unit 24 and a ball removing unit 26. The holder 21 arranges the electrodes 71 to face upwards and holds the substrate 7 to be disposed horizontally. The holder raising unit 29 is used to freely raise or lower the holder 21, and to position the substrate 7 at a predetermined height. The mask horizontal moving unit 23 is used to support the mask 22 in the horizontal direction, move the mask 22 horizontally, and then position the mask 22 on the substrate 7 that is situated at the predetermined height. The ball supplying unit 24 is used to supply the solder balls B to the upper surface of the mask 22. The ball removing unit 26 is used to remove the redundant solder balls B from the upper surface of the mask 22.

The holder 21, the holder raising unit 29, the mask horizontal moving unit 23, the ball supplying unit 24 and the ball removing unit 26 can be suitably selected according to requirement of cost or quality, etc. For example, the substrate 7 can be simply disposed on a table. Positioning the substrate 7 or the mask 22 can also be manual. Supplying or removing the solder balls B can also be manual.

Next, the structures of the holder 21, the holder raising unit 29, the mask horizontal moving unit 23, the ball supplying unit 24 and the ball removing unit 26 will be sequentially described in detail.

1-1 Mask

The mask 22 comprises an upper surface (one surface) 222, a lower surface (another surface) 223 opposite to the upper surface, and positioning openings 221. The positioning openings 221 correspond to the arrangement pattern in which the openings go through the upper surface 222 and the lower surface 223 so that the solder balls B can be inserted therein.

As shown in FIG. 4(b), the mask 222 can be a structure that has a protrusion portion 224 so that the lower surface 223 is not in contact with the substrate 7, or can be a structure that does not have the protrusion portion 224 so that the lower surface 223 is in contact with the substrate 7. For any one of the above structure, when positioning the lower surface 223 of the mask 22 to the electrodes 71, the distance t from the upper surface of the electrode 71 to the upper surface 222 of the mask 22 with respect to the diameter of the solder ball B preferably satisfies the condition of $0.8 \leq t/d \leq 1.4$. Namely, when the thickness of the mask t/d is less than 0.8, the top of the solder ball B protrude excessively from the upper surface 222 of the mask 22; therefore, the filled solder ball B can be easily detached from the positioning opening 221. When t/d is larger than 1.4, a plurality of solder balls B is easily filled into the positioning opening 221.

The positioning opening 221 has a first taper hole 2211 wherein the opening gradually becomes wider from the upper surface to the lower surface. The crest line 2211b of the upper edge portion 2211a of the first taper hole 2211 is preferably higher with respect to the center of the solder ball B placed on the upper surface 771 of the electrode 71. Namely, when being transferred towards the positioning opening 221, the solder ball B approaches one side wall of the positioning opening 221. By using the positioning opening 221 having the first taper hole 2211, the upper hemisphere of the solder ball B is in contact with the upper edge portion 2211a of the first taper hole 2211, and is blocked by the edge portion 2211a. Therefore, even though being subjected to an external force, such as vibration, etc., it is difficult for the solder ball B to slip from the positioning opening 221. In addition, when lifting the mask 22 in an upward direction, the wall of the mask 22 moves along a direction away from the solder ball B even though the solder ball B is in contact with the aforementioned wall. The chances that the solder ball B is dragged and removed from the electrode 71 become smaller.

The shape of the first taper hole 2211 can be substantially frustum shape. If the first taper hole 2211 is formed in frustum shape, no part of the sidewall of the first taper hole 2211 has angles. Therefore, the solder ball B can be smoothly loaded into the positioning opening 221 without any obstruction due to the presence of angles.

Furthermore, as shown in FIG. 6(a), the diameter D1 of the upper opening of the first taper hole 2211 is preferred to be larger for allowing the solder ball B to pass therethrough easily. However, if the diameter D1 is too large, not only the position variation of the solder balls B placed on the electrodes 71 becomes large, the redundant solder balls B will also be easily stagnated at the upper part of the positioning opening 221. When removing the mask 22, the stagnated solder balls B will fall onto the substrate 7 and the solder balls B placed on the electrodes 71 may flip off, thereby lowering the placement ratio. Therefore, the diameter D1 is preferably about 1.2 to 1.4 d. In addition, the diameter of the lower opening 2211d of the first taper hole 2211 is preferred to be larger within a range of an allowed strength for the mask 22. Namely, as the lower opening 2211d is getting larger, the slope of the wall of the first taper hole 2211 becomes larger. As a result, the solder ball B is more fully blocked by the upper part, and it is more difficult for the solder ball to slip out accidentally. But, if the tolerance range of the variation of the placement position for the solder ball B is b, equal to or less than (b+d), is preferred, so that the solder balls B will not be detached from the electrodes 71 when the mask 22 is removed.

The mask 22 is not particularly limited to the above description. For example, as shown in FIG. 7(a), the upper surface 222a may be formed slightly tilted to the lower surface 223. Furthermore, as the mask 22b shown in FIG. 7(b), the positioning opening 221b can be in coaxial with a cylindrical hole 2212 formed at the upper part of the first taper hole 2211. In addition, as the mask 22c shown in FIG. 7(c), the positioning opening 221c can be formed coaxially with a cylindrical hole 2213 at the lower part of the first taper hole 2211.

Other example for the mask will be described below.

Figure 5:
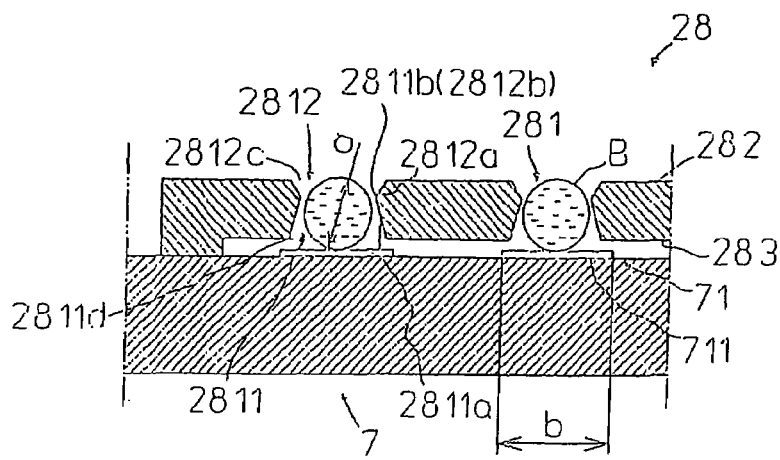
FIG. 5 shows a variation example of the arrangement member in FIG. 4.
Figure 6:
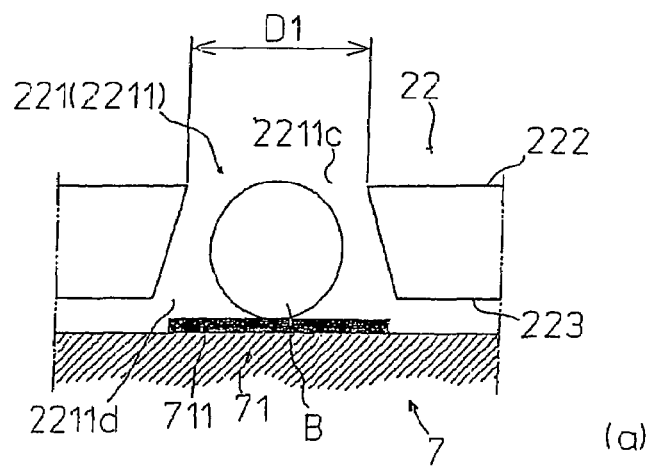
FIG. 6 is a partially enlarged cross-sectional diagram of the arrangement members in FIGS. 4 and 5.
Figure 6:
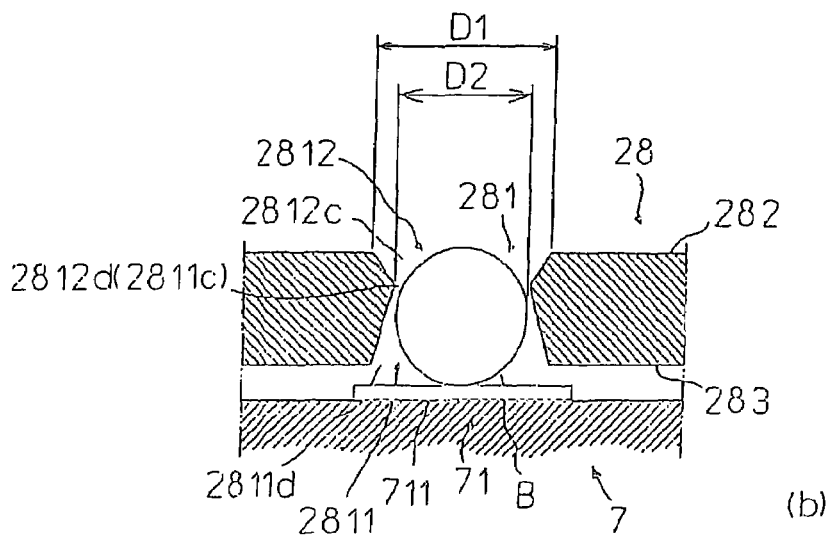
Figure 7:
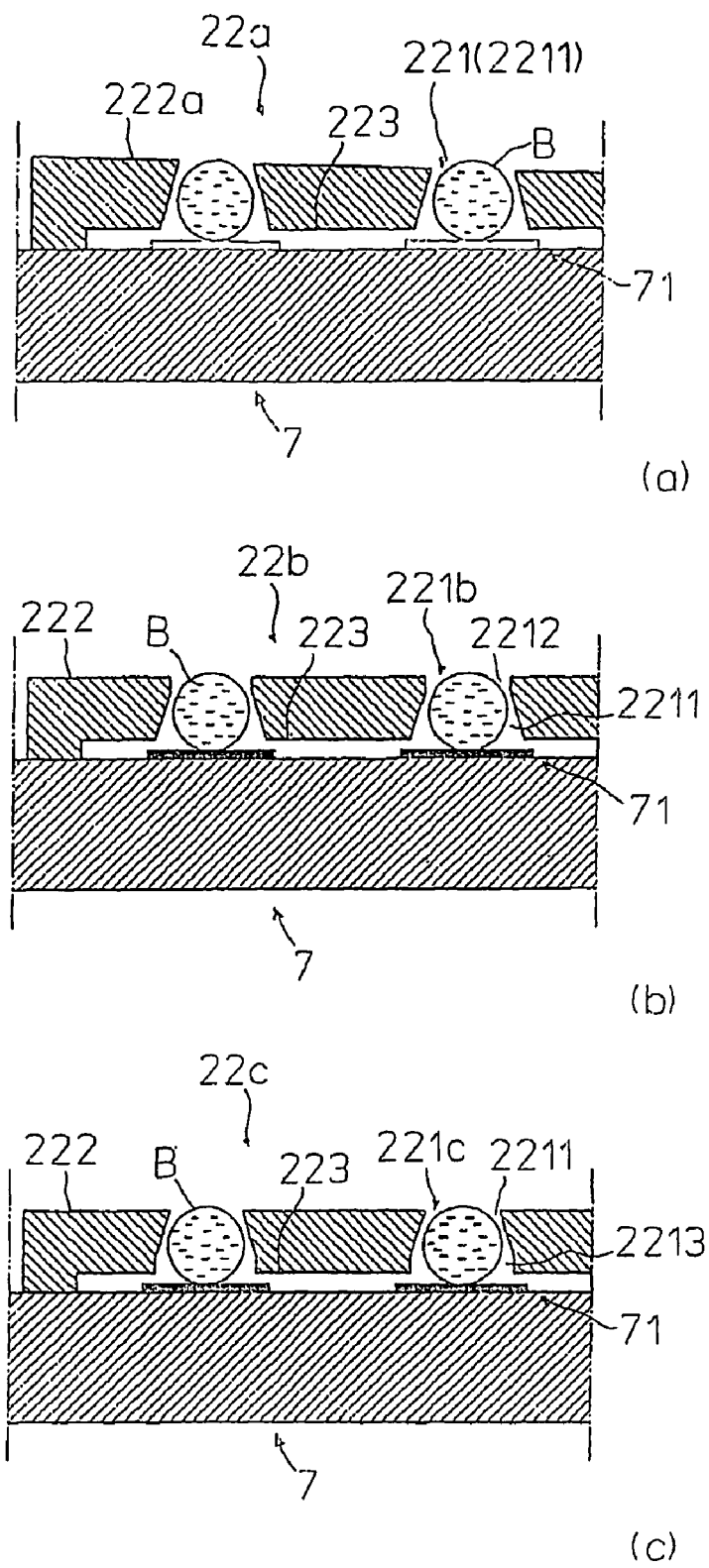
FIG. 7 shows another variation example of the arrangement member in FIG. 4
Figure 8:
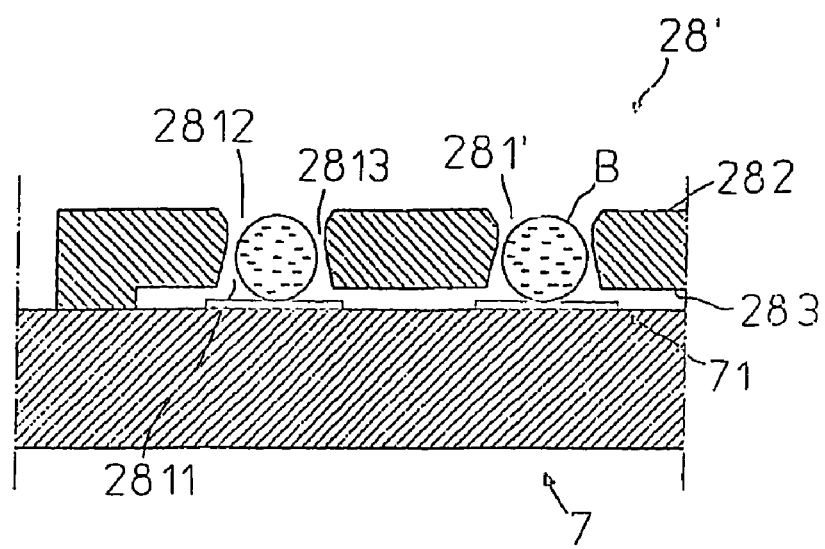
FIG. 8 shows a variation example of the arrangement member in FIG. 5.

As shown in FIG. 5, the mask 28 comprises a positioning opening 281 having a drum shape. The positioning opening 281 has a first taper hole 2811 that is basically the same as the aforementioned first taper hole 2211, and has a second taper hole 2812. The second taper hole 2812 is formed coaxially with the first taper hole 2811, and is getting wider along a direction from the lower surface 283 to the upper surface 282. By using the positioning opening 281, the solder ball B supplied to the upper surface 282 of the mask 28 can be guided by the second taper hole 2812, and the solder ball B is more smoothly loaded into the positioning opening 281. In addition, if the crest line 2812b at the lower edge portion 2812a of the second taper hole 2812 or the crest line 2811b at the upper edge portion 2811a of the first taper hole 2811 (in this example, the crest line 2811a and the crest line 2811b are the same) is formed in a beveling shape or an R shape, it is effective for the solder balls B to be more smoothly guided.

The shape of the first and the second taper holes 2811, 2812 can be substantially a frustum shape. If the first and the second taper holes 2811, 2812 are formed in frustum shape, t no part of the sidewall of the first and the second taper holes 2811, 2812 has angles. Therefore, the solder ball B is more smoothly loaded into the positioning opening 281 without any obstruction due to the presence the angle parts.

As shown in FIG. 6(b), the diameter D1 of the upper opening 2812c of the second taper hole 2812 can be set to be 1.2 to 1.4 d with respect to the diameter of the solder ball B. The diameter of the lower opening 2811d of the first taper hole 2811 is preferably set to be equal to or less than (b+d) if a tolerance range of the placement position variation for the solder ball B is set to b. The reason is the same for the mask 22 above.

By using the mask 28, the variation of the placement position for the solder ball B can be reduced. As shown in FIG. 6(a), in the case of the mask 22, the upper opening 2811c of the first taper hole 2811 of the positioning opening 281 is formed with a size D1 capable for the solder ball B to be loaded smoothly. The first taper hole 2811 of the positioning opening 281 is a hole that extends towards the lower side. Therefore, the position of the solder ball B in the planar direction is restricted by the narrowest upper opening 2811c. As a result, the solder ball B will be placed on the electrode 71 with the variation corresponding to the size D1 of upper opening 2811c.

On the other hand, as shown in FIG. 6(b), in the case of the mask 28, the upper opening 2812c of the second taper hole 2812 of the positioning opening 281 is formed with a size D1 capable the solder ball B to be loaded smoothly; however, the second taper hole 2812 is a hole that narrows downwards. For the positioning opening 281, the size D2 of the lower opening 2812d (same as the upper opening 2812c of the first taper hole 2811 in the example) is the narrowest. The position of the solder ball B is thus restricted to move in the planar-direction by the lower opening 2812d. For example, the size D2 of the lower opening 2812d is made slightly larger than the diameter of the solder ball B, so that the solder ball B can pass therethrough. In this way, the variation of the placement position of the solder ball B is extremely reduced tremendously.

The shape of the positioning opening 281 is not particularly restricted to the above description. For example, as the mask 28' shown in FIG. 8, the positioning opening 281' can be formed with a cylindrical hole 2813 between the first and the second taper holes 2811, 2812, and the cylindrical hole 2813 is coaxial with the first and the second taper holes 2811, 2812.

The masks 22, 28 is a kind of a jig for repeated usage, wherein a plate substance, such as a metal plate, a resin plate, a laminated article, or a film-formed article, etc, can be used. Since the positioning openings 221, 281 has to be formed with a correct shape and size, the positioning openings 221, 281 is preferably formed by processing the substance by a laser process or an etching process. In addition, it is desirable that the masks 22, 28 are manufactured using nickel, etc. as a material by an electroformation processing since the positioning openings 221, 281 are simultaneously formed.

Furthermore, it is desirable that the mask 28 uses a laminated plate having an etching barrier layer as a base substance. Regarding the laminated plate, an intermediate layer is the base substance, i.e., the etching barrier layer, and the laminated plate is laminated by three layers that use different etchants, in which the first layer is a nickel alloy, the second layer, i.e., the intermediate layer is a titan alloy, and the third layer is the same as the first layer, i.e., a nickel alloy. According to the laminated plate, resist films with patterns capable of forming the positioning opening are formed on the first and the third layer, and then an etching process is performed. Since the intermediate layer is an etching barrier layer, the intermediate layer will not be removed by the etching process. Next, an etching process is performed. At this time, the first and the third layers are not removed. According to the laminated plate, a drum-shape throughhole like the positioning hole 28 of the mask 28 is precisely formed.

1-2 Transfer Device

Figure 9:
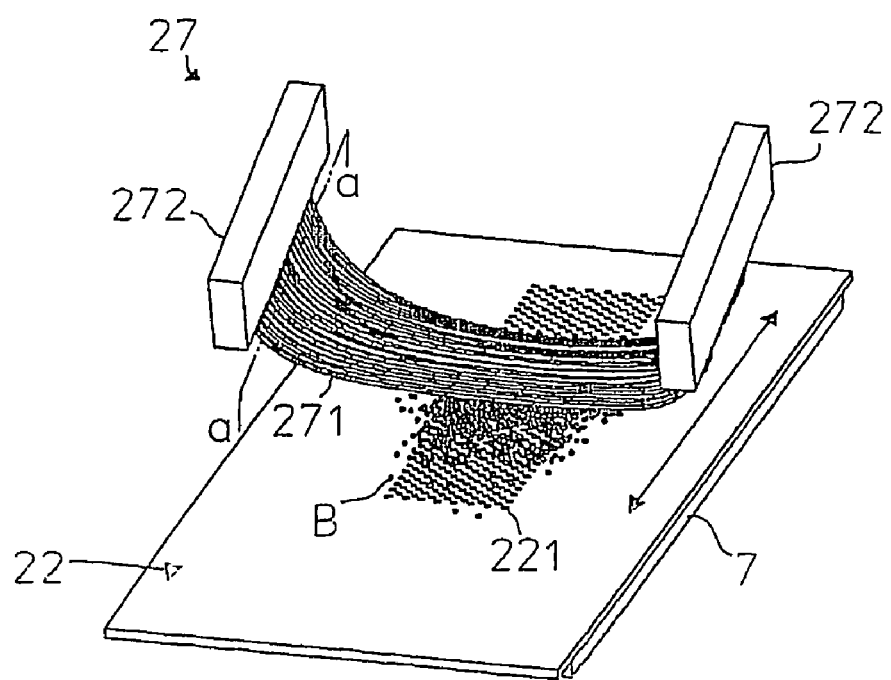
FIG. 9 is a perspective view of the transfer device and the arrange member of the placement unit in FIG. 2.

The transfer device 27 has two or more line members 271 arranged in a manner that cores of the line members are substantially aligned, as shown in FIG. 9. When the solder balls B are disposed, the transfer device 27 is set in a manner that the line members 271 can be in a substantially horizontal position to contact with the solder balls B supplied to the upper surface of the mask 22, and moves horizontally with respect to the upper surface of the mask 22.

A pair of holding members indicated by reference number 272 keeps the line members 271 in a shape having a curved abdomen therebetween. The abdomen refers to a portion of the line members 271 that is not held by the holding members. Specifically, as shown by the symbol F in FIG. 10(*a*), the abdomen is a portion, which is substantially formed as a straight line, in contact with the solder balls B.

Figure 10:
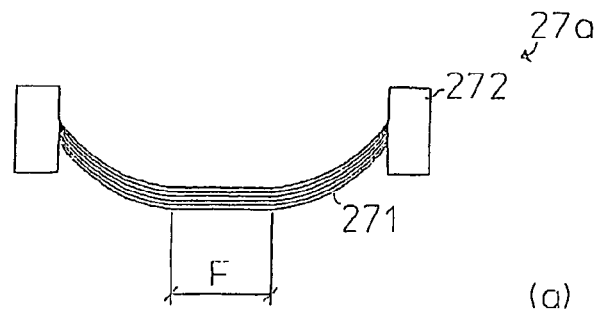
FIG. 10 is a variation example of the transfer device in FIG. 9.
Figure 10:
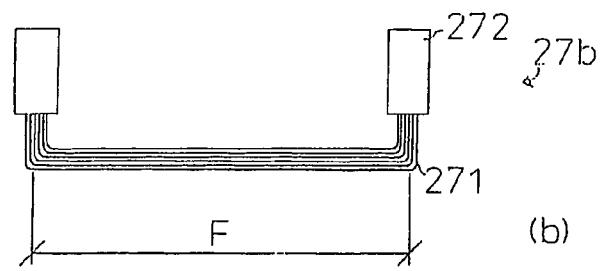
Figure 10:
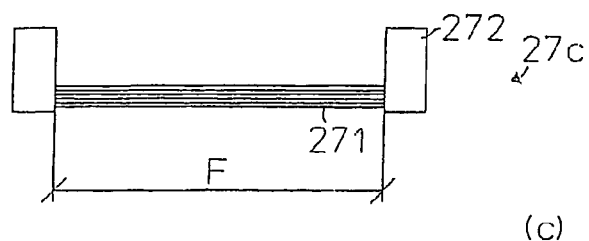
Figure 10:
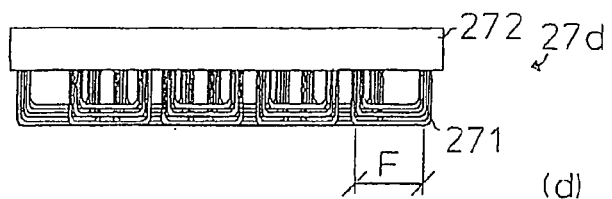
Figure 10:
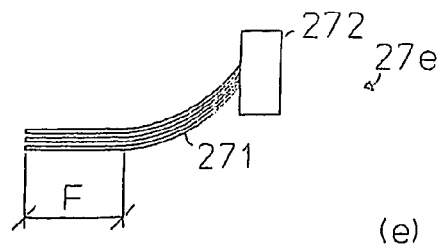

The shape of the line members 271 stretched tightly between the holding members 272 can be suitably adjusted by adjusting the interval of the holding members 272 and direction, etc. Namely, as shown in FIGS. 10(*a*), (*b*), the abdomen can be substantially an arch shape, a "⊐" shape or a U shape since the length of the abdomen can be short when the placement range of the solder balls B is small. Since a long abdomen is required when the placement range is wide, the abdomen can be substantially a shape of straight line. As shown in FIG. 10(*d*), a plural groups of line members 271*c* an set for increasing the rigidity of the line members 271. In addition, as shown in FIG. 10(*e*), the line members 271 can be held at one end by the holding members 272.

The transfer device 27 is moved horizontally by human hands or a mechanical moving structure (such as a one-axis table or a cylinder, etc.). In addition, if the transfer device 27 can be positioned to be able to move vertically with respect to the upper surface of the mask 22, the case that the solder balls B are transported by reciprocating action is particularly suitable for automation.

The transfer device 27 is further described in detail.

Figure 11:
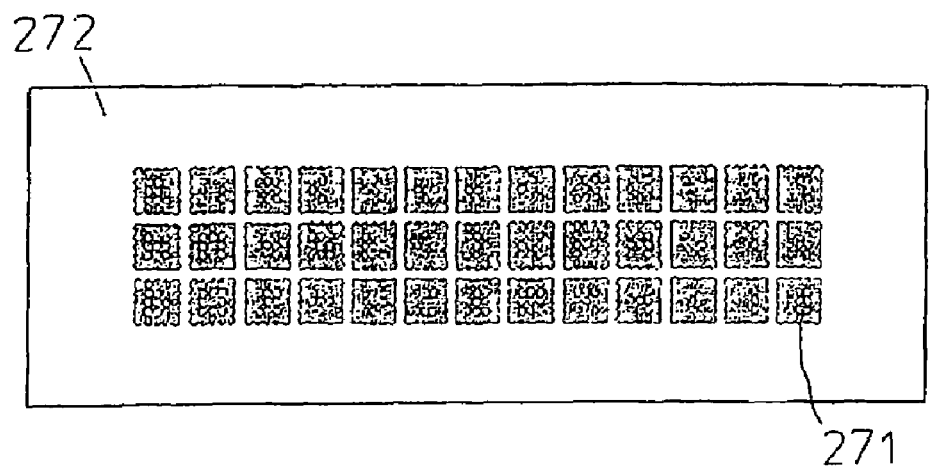
FIG. 11 is a cross-sectional view along the cutting line a-a in FIG. 9, and is a partially enlarged cross-sectional diagram of the transfer device.

As shown in FIG. 11, regarding the transfer device, its plural line members 271 are closely arranged along the moving direction (the horizontal direction with respect to the drawing) and the up-and-down direction, so that the plural line members 271 are in a state of close contact. Specifically, as shown in the drawing, many line members 271 are united together and closely fixed on the holding member 272. The rigidity of the respective line member 271 is low, but the entire line members have rigidity by closely arranging the line members 27 in such manner. Therefore, according to the line members 271 in which a plurality of lines are closely arranged, the plural solder balls B delivered to the mask 22 can be entirely captured, and the solder balls B are difficult to be deformed even though they are impacted with a reaction force from the captured solder balls B.

For discharging the charged solder balls B during transportation and preventing the solder balls B from adhering to the substrate 7 and the line members 271, the line members 271 are preferably equipped with some conductive materials, such as metal or carbon, etc. In addition, for preventing the solder balls B from adhering to the surface of the line members 271 due to the adhesion of water, at least, a fluoride process is preferably carried out on the surface of the line members 271 to provide water repellency.

A variety of cross-sections can be selected for the line members 271, but in view of easy acquisition, a substantially circular shape is desired for industrial production. When the cross-section of the line members 271 is substantially circular in shape, it is preferred that the diameter of the circular shape is set to be smaller than the solder ball B since it is difficult for the line members 271 to attach onto the solder balls B after being in contact with the solder balls B that are supplied to the upper surface of the mask 22.

Figure 12:
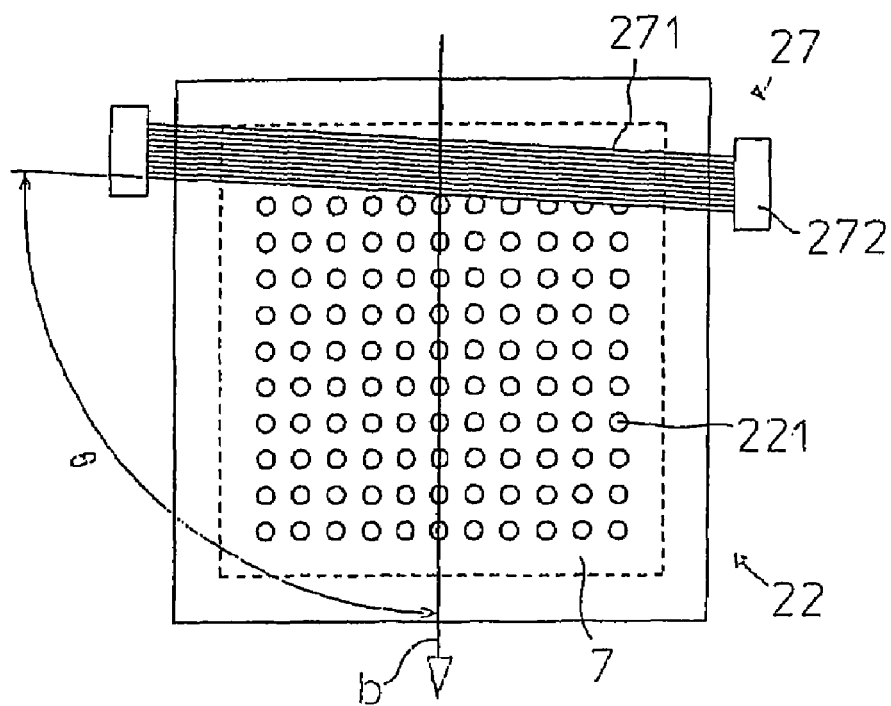
FIG. 12 is a plane view showing the transfer device and the arrangement member of the placement unit in FIG. 2.

The top-viewed position of the line members 271 during the horizontal movement is not particularly restricted. However, as shown in FIG. 12, when the line members 271 are tilted to move with respect to the moving direction of the line members 271, the solder balls B could have escaped from the abdomen end while the line members 271 move along the abdomen side. Therefore, an intersection angle θ between the moving direction of the line members 271 and the core axis of line members 271 is preferably set at a range between 45 degrees to 135 degrees. Preferably, the intersection angle θ is set at about 90 degrees, so that line members 271 moves substantially along a direction perpendicular to the core axis. In addition, it is preferred that the line members 271 are horizontally moved while being in contact with the upper surface of the mask 22, so that the solder balls B will not escape from the gap between the line members 271 and the mask 22 to remain on the mask 22.

Figure 14:
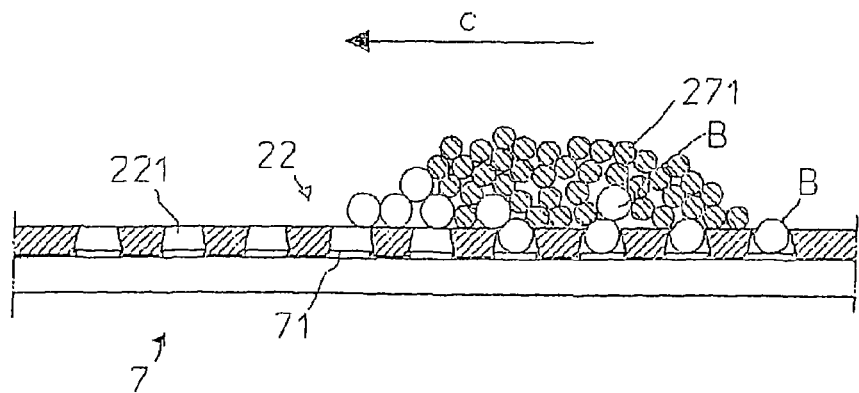
FIG. 14 is a diagram for describing the operation of the transfer device in FIG. 9.

It is preferred that the line members 271 are formed by flexible materials using soft resin and rubber, paper, or metal, etc. as the main substance since the solder balls B can be transported without deformation. Furthermore, as shown in FIG. 14, in the case that the line members 271 have flexibility, the escaped solder balls B will be captured by other line members 271 next to the deformed members' backside even though some line members 271 are deformed and the solder balls B escape from the gap formed by the deformed line members 271. Therefore, the remaining solder balls B that are not inserted into the positioning openings 221 will not escape to the backside, and moves to a prescribed position of the mask 22, for example, under a situation that the solder balls B are captured by the line members 271. If the remaining solder balls B are recycled by proper methods, the opportunity that the solder balls B remain on the mask 22 can be reduced. In addition, the line members 271*c* an be maintained in a soft condition between the holding members 272.

Furthermore, if the line members 271 are formed by materials using resins, rubber or metal as the main substance with a predetermined waist strength, i.e., with elasticity, and the line members 271 are arranged to press on the upper surface of the mask 22, in addition to the gravity, a downward force caused by the reaction force of the elastically deformed line members 271 also acts on the solder balls B that are being transported to the tops of the positioning openings 221. In addition to gravity, the solder balls B where the reaction force acts thereon are more smoothly and precisely loaded into the positioning openings 221.

1-3 Holder

As shown in FIG. 2, the holder 21 comprises a wall portion 213 standing at the left side of the holder 21, an insertion recess 212 for freely loading the substrate 7, an opening 211a opened to the bottom of the insertion recess 212, an opening 212b opened to the external, a fluid passage 211 for connecting the openings 211a, 211b, and a negative pressure generating unit for connecting the fluid passage 211 and generating a negative pressure in the opening 211b. After the substrate 7 is loaded onto the bottom of the insertion recess 212, the negative pressure is generated by the negative pressure generating unit, so that the substrate 7 is tightly fit to the bottom of the insertion recess 212. Therefore, the substrate 7 is always kept in a horizontal position.

1-4 Holder Raising Unit

The initial position of the holder 21 before the substrate 7 is loaded is set to a position at a lower side with respect to the drawing as shown in FIG. 2(b). After the substrate 7 is loaded on the holder 21, the holder 21 is raised by the holder raising unit 29 from the initial position to a predetermined height. The substrate 7 is positioned to a placement position as shown in FIG. 2(a) for placing the solder balls B. After the solder balls B are placed onto the substrate 7, the holder raising unit 29 lowers the holder 21 to its initial position, and then the mask 22 is removed from the substrate 7.

1-5 Mask Horizontal Moving Unit

The initial position of the mask 22 is set to a position at right side with respect to the drawing as shown in FIG. 2(b). After the substrate 7 is positioned at the placement position, the mask horizontal moving unit 23 moves the mask 22 from the initial position to the left side. As shown in FIG. 2(a), the left end surface of the mask 22 is in contact with the right surface of the wall portion 213, and then the mask is stopped moving. Then, as shown in FIG. 4(a), the mask 22 is positioned over the substrate 7 in a manner that the positioning openings 221 correspond to the electrodes 71. After the solder balls B are placed onto the substrate 7 and the holder 21 is lowered, the mask horizontal moving unit 23 returns to its initial position.

1-6 Ball Supplying Unit

The ball supplying unit 24 is arranged above the right end of the mask 22, and has a supplying outlet for supplying the solder balls. The ball supplying unit 24 weights a fixed amount of solder balls B, which is larger than the number of the electrodes 71, and then supplies the solder balls B onto the mask 22.

1-7 Ball Removing Unit

The ball removing unit 26 is arranged at the left end of the mask 22, and has an absorbing inlet 261 for absorbing the solder balls B. The balls remaining on the mask 22 are absorbed and removed.

1-8 Operation of Displacement Device

The operation of the displacement device 1a including the displacement unit 2 is described.

1) Step for Positioning the Mask (The First Step)

As shown in FIG. 13(a), the mask 22 is positioned with respect to the substrate 7. At this time, the mask 22 is positioned in a manner that in the planar direction, the positioning openings 221 of the mask 22 correspond to the electrodes 71 of the substrate 7, and in the vertical direction, the lower surface of the mask 22 forms a predetermined relationship with respect to the upper surface of the substrate 7. In the case shown in FIG. 13(a), the mask 22 is positioned so that the lower surface of the mask 22 is in contact with the upper surface of the electrodes 71. But, when the flux, etc. is coated on the electrodes 71, the mask 22 can be positioned in a manner that the lower surface of the mask 22 and the substrate 7 are separated by a predetermined gap, so that the flux is not adhered to the mask 22.

2) Step for Placing Solder Balls (The Second Step)

The solder balls B with a number larger than the electrodes 71 are supplied to the upper surface of the mask 22 by using the ball supplying unit 24. The transfer device 27 is arranged in a manner that the line members 271 are in a substantially horizontal position to be in contact with the solder balls B supplied to the upper surface of the mask 22. Then, the transfer device 27 is horizontally moved with respect to the upper surface of the mask 22.

Then, as shown in FIG. 14, the solder balls B are captured by the line members 271 that move in a substantially horizontal direction with respect to the upper surface of the mask 22, moved to the tops of the positioning openings 221, loaded into positioning openings 221, and then placed onto the electrodes 71 as shown in FIG. 13(b). Since the line members 271 move horizontally in a manner that the abdomen sufficiently larger than the positioning openings 221 is parallel with the upper surface of the mask 22, the line members 271 will not enter the positioning openings 221 due to the restriction of the positioning openings 221. Therefore, the solder balls B that have been inserted into the positioning openings 221 are seldom to be scraped out and separated from the electrodes 71. In addition, the solder ball B is loaded into the positioning opening 221 that has the first taper hole 2211 with an edge crest line 2211b be higher to the upper side of the center of the ball B, and the movement of the solder ball B along the sidewall of the first taper hole 2211 is restricted. Therefore, even the line members 271 enter the positioning openings 221, the solder balls B loaded into the positioning openings 221 are seldom be easily scraped out and separated from the electrodes 71.

The remaining solder balls B are moved to the ball removing unit 26 by the transfer device 27, and then removed by the ball removing unit 26. As shown in FIG. 14, even though some line members 271 are deformed and the solder balls B escape from gaps formed by the deformed line members 271, the escaped solder balls B are captured by other line members 271 next to backside. Therefore, the remaining solder balls B, not loaded into the positioning openings 221, will not escape to the backside, and move to the ball removing unit 26 to be captured by the line members 271.

3) Step for Removing the Mask from the Substrate

As shown in FIG. 13(c), the holder raising unit 29 is lowered and the mask 22 is removed from the substrate 7.

In this manner, if the substrate 7 where the solder balls B are placed is reflowed, connection bumps 72 are formed as shown in FIG. 13(d).

2. The Second Embodiment

The second embodiment of the present invention is described with reference to FIGS. 15 to 17. Additionally, in the drawings, constituents substantially the same as the placement device 1a of the first embodiment are labeled with the same symbols, and their structure and detail operations are omitted (following descriptions for other embodiments are the same).

As shown in FIG. 1, the placement device 1b of the second embodiment comprises a placement unit 3 for arranging and placing the solder balls onto the substrate, i.e., the base unit.

Figure 15:
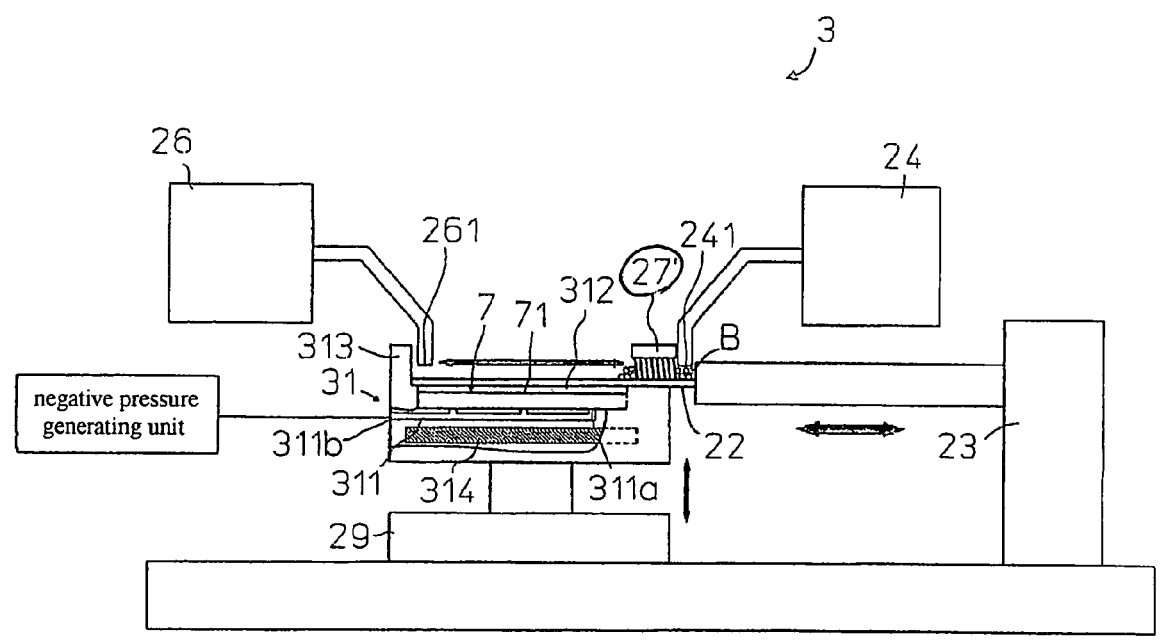
FIG. 15 is a side view of the placement unit of the placement apparatus of the second embodiment in FIG. 1.

As shown in FIG. 15, the placement unit 3 of the second embodiment and the placement unit 2 of the first embodiment are basically the same structure. The placement unit 3 comprises a mask 22, a transfer device 27', a holder 31, a holder raising unit 29, a mask horizontal moving unit 23, a ball supplying unit 24 and a ball removing unit 26. The mask 22 is an arrangement member for arranging the solder balls B onto the electrodes 71 of the substrate 7. The transfer device 27' is moved horizontally to the upper surface of the mask 22 positioned on the substrate 7 by a moving unit (not shown), so as to transfer the solder balls B. In order to suitable for automation, the holder 31 keeps the position of the substrate 7 horizontally to make the electrodes 71 to face upwards. The holder raising unit 29 is used for freely raising or lowering the holder 31, so as to position the substrate 7 at the predetermined height. The mask horizontal moving unit 23 supports the mask horizontally, moves the mask 22 along the horizontal direction, and then positions the mask 22 on the substrate 7 that is positioned at the predetermined height. The ball supplying unit 24 is used for supplying the solder balls B onto the mask 22. The ball removing unit 26 is used for removing the remaining solder balls B from the upper surface of the mask 22.

For the placement unit 3 of the second embodiment, the differences between that and the placement 2 of the first embodiment are the aforementioned transfer device 27' and a magnetism generator 314. The transfer device 27' has line members 271' made of soft magnetic materials, such as magnetic stainless steel, etc. The magnetism generator 314 is assembled into the holder 31. The magnetism generator 314 is described in details as follows. In addition, although the magnetism generator 314 is assembled into the holder 31 to be suited for automation, the magnetism generator 314 can be individually used, or assembled into other parts used for loading the substrate 7.

2-1 Magnetism Generator

Figure 16:
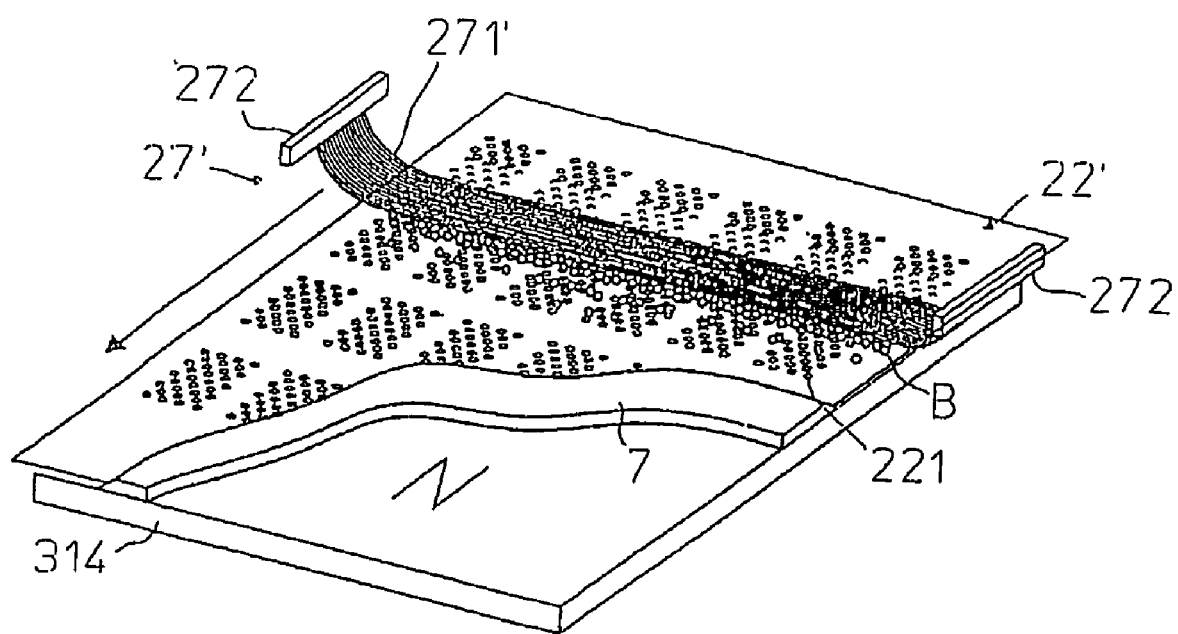
FIG. 16 is a perspective view showing the transfer device and the arrangement member of the transfer device in FIG. 15 and a magnetism generator.
Figure 17:
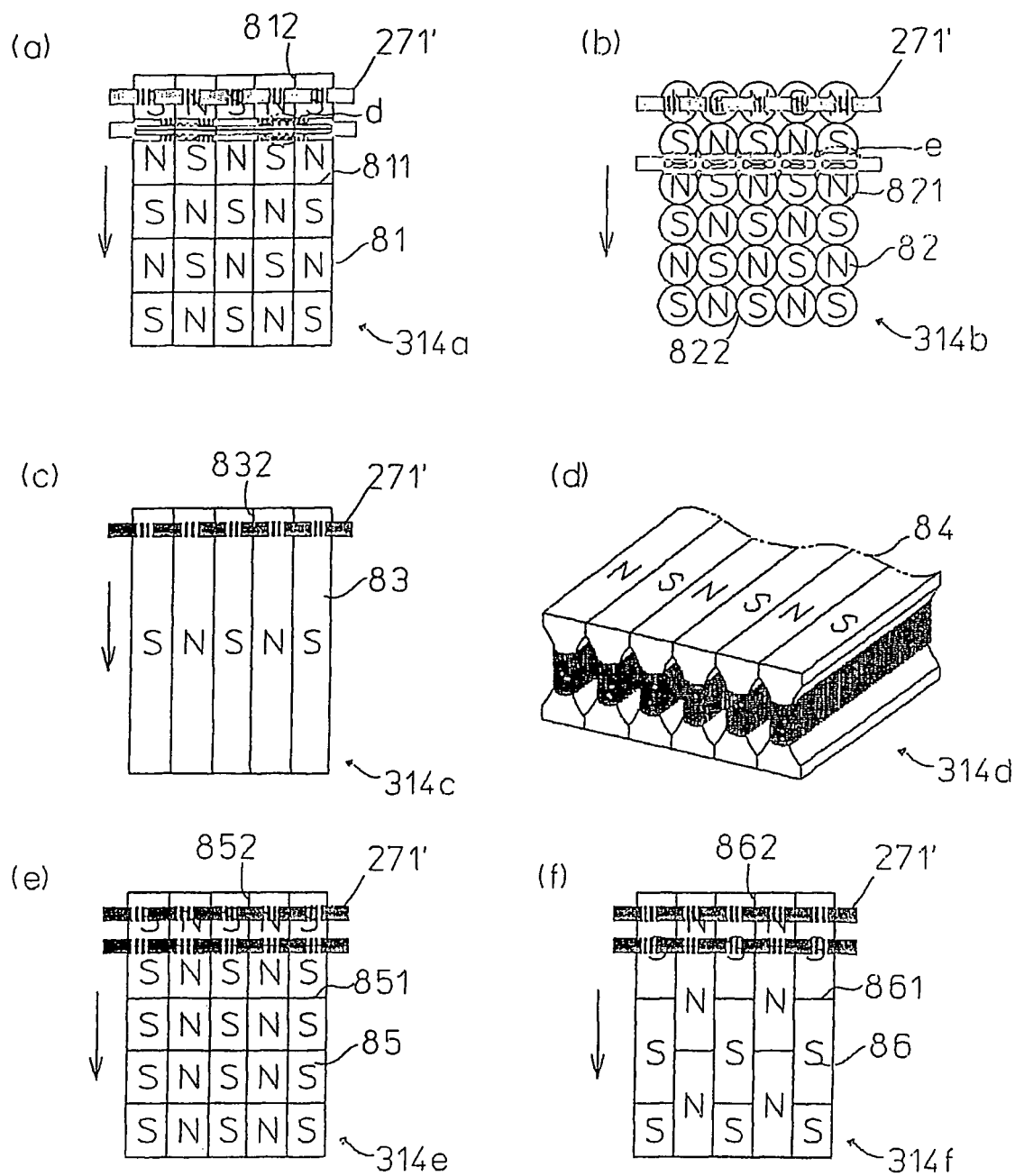
FIG. 17 is a diagram showing a variation example of the magnetism generator in FIG. 15.

The magnetism generator 314, as shown in FIG. 16, is a substantially plate-shaped permanent magnet, arranged in a planar manner with respect to the substrate 7. The upper surface (one surface) of the magnetism generator 314 with respect to the transfer device 27' is magnetized to a predetermined pole (for example, the positive (N) pole). In addition, the magnetism generator 314 can be arranged in close contact with the substrate 7, or can be arranged with a suitable gap with respect to the substrate so that the generated magnetic force can properly act on the line members 271'. The magnetism generator 314 arranged in the above manner will draw the line members 271' downwards by the generated magnetic force, in which the line members 271' move horizontally on the upper surface of the mask 22.

Magnetism generators 314a, 314b shown in FIGS. 17(a), (b) can be selected as the magnetism generator. In order to implement the magnetic generator where the magnetism generators 314a, 314b have a plurality of magnetic areas and the adjacent magnetic areas are arranged by different polarities, the magnetism generators 314a,314b have a plurality of permanent magnets 81, 82 with a substantially cubic shape, rectangular solid shape, or circular plate shape. The magnetism generators 314a, 314b are arranged in a substantially plate shape, so that the adjacent permanent magnets 81, 82 have different polarities. According to the magnetism generators 314a, 314b, the gap between the magnetic force lines created by the permanent magnet 81, 82 is short, and the line members 271' are more strongly and equally drawn to lower side.

When applying such magnetism generators 314a, 314b, as shown in the drawings, the line members 271' are preferably arranged in a manner that the core axes of the line members 271' are substantially parallel with the row direction of the polarities of the permanent magnets 81, 82. According to the arrangement of the line members 271', the line members 271' move horizontally on the upper surface of the mask 22 in a manner substantially parallel or perpendicular to the magnetic force lines created by each of the permanent magnets 81, 82. Therefore, the deformation of the line members 271, caused by the density difference of the magnetic force line created by the magnetism generators 314a, 314b, can be suppressed.

A magnetism generator 314c shown in FIG. 17(c) can be selected as the magnetism generator. In order to implement the magnetic generator where the magnetism generator 314c has a plurality of magnetic areas and the adjacent magnetic areas are arranged by different polarities and each magnetic area is arranged in one column, the magnetic generator 314c comprises a plurality of permanent magnets 84 with a substantial square-pillar shape, and the sidewalls are closely arranged to form a substantial plate shape, so that the adjacent permanent magnets 83 have different polarities.

In comparison with the aforementioned magnetism generators 314a, 314b, the magnetism generator 314c has following improvement. Namely, as the description for the magnetism generator 314a shown in FIG. 17(a), a boundary is present between magnetic areas along two directions indicated by symbols 811, 812. For example, as shown in the drawing, when arranging the line members 271', magnetic force lines are generated to intersect the line members 271' at the boundary 811 parallel with the core axes of the line members 271'. When the horizontally moving line members 271' cross atop the boundary 811, the line members 271' are pulled towards the permanent magnets 81, 82 next to the boundary 811. As a result, the line members 271' are deformed as indicated by the symbol d in the drawings. In this manner, as the line members 271' are deformed, the solder balls B escape from the deformation portions and the solder balls B can not be smoothly loaded into the positioning openings at the deformation portions.

On the other hand, as shown in FIG. 17(c), the magnetism generator 314c has the boundary 832 only along one direction as indicated by the symbol 832 in the drawing. Therefore, if the line members 271' are arranged as shown in the drawing, the magnetic force lines created at the boundary 832 are parallel with the core axes of the line members 271', and will not intersect with the line members 271'.

Magnetism generators 314e, 314f can be also selected as the magnetism generator. The magnetism generators 314e, 314f. Regarding the magnetism generator 314c, the permanent magnets 85, 86 having the same polarity are arranged along one direction to form the magnetic area. According to this configuration, it is not necessary to prepare a long permanent magnet 83 as shown in the magnetism generator 314c; and thus the magnetism generators 314e, 314f can be made at a low cost.

A magnetism generator 314d as shown in FIG. 17(d) can be also selected as the magnetism generator. In the magnetism generator 314d, electromagnets 84 are used to form the magnetic areas. The magnetic force can be freely controlled according to a current amount applied to the electromagnets 84. Therefore, the magnetism generator 314d can easily correspond to various conditions even though the length and the thickness of the line members 271' are changed due to the sizes of the solder balls B and the substrate 7.

In the above descriptions, a plurality of permanent magnets or electromagnets is used to form the magnetic areas, but a method of dividing one magnet into a plurality of magnetic areas can be also used.

According to the placement unit 3 including the above magnetism generator 314, the line members 271' are pulled downwards by the magnetic force generated by the magnetism generator 314, and the abdomen of the line members 271' are pressed onto the upper surface of the mask 22. The line members 271' are thus horizontally moved under the above situation. The line members 271' capture the solder balls B, and then move to the top of the positioning openings B. A downwardly pressing force caused by the magnetic force is acting on the abdomen portion of the line members 271'. Therefore, the pressing force is acting on the solder balls B, and the solder balls are smoothly inserted into the positioning openings 221. Regardless of the status of the upper surface of the mask 22, such as the roughness, the pressing force of the line members 271' caused by the magnetic force is kept constant. Therefore, the line members 271 are seldom entangled along the moving direction, and an occurrence of a recoil reaction can be reduced. Thus, the solder balls B are stable and loaded into the positioning openings 221.

2-3 DESCRIPTIONS FOR EXAMPLES OF FIRST AND SECOND EMBODIMENTS

1) EXAMPLE 1

The solder balls B are placed onto five substrates 7 using the placement device 1a of the first embodiment under following conditions.

The mask 22 is made of SUS 430 with a thickness of 80 μm. The mask 22 is formed to have 10200 positioning openings 221 with an area of 25 mm €. Each opening corresponds to an electrode 71 on the substrate 7, and the diameter of the positioning opening 22 is 90 μm. The line member 271' of the transfer device 17 has a substantially circular cross-section with a diameter of φ75 μm, and a abdomen portion to cover the range of the positioning openings 221. The solder ball B is mostly made of Sn and has a diameter of 80 μm. One by one, 12000 solder balls B are delivered to the upper surface of the mask 22. SANDARON (Trademark, made by Asahi Kasei Corporation) is used as the line members 271. The above conditions are basically the same for the following described example 1 and the comparison example.

2) EXAMPLE 2

The solder balls B are placed onto 5 substrates 7 using the placement device 1b of the second embodiment. In addition, ferrite magnetic stainless steel, i.e., SUS 430 is used as the line members 271.

3) COMPARISON EXAMPLE

A transfer device having sharp-and-brush shape line members is assembled into the placement device 1a of the first embodiment. The line members are arranged to be perpendicular to the upper surface of the mask 11, and the line members are horizontally moved in a manner that their sharp portions are in contact with the mask 22, so as to place the solder balls B.

The non-filling rate and the remaining rate for the solder balls B in examples 1, 2 and comparison example are listed in Table 1. The remaining ratio is defined as (numbers of solder balls B remaining on the mask 22)/the number of solder balls that have been delivered to the mask).

TABLE 1

|  | non-filling ratio | remaining ratio |
|---|---|---|
| Example 1 | 0.173% | 0% |
| Example 2 | 0.094% | 0% |
| Comparison example | 55.340% | 2.3% |

3. Third Embodiment

The third embodiment of the present invention is described with reference to FIG. 1 and FIGS. 18-20.

As shown in FIG. 1, the placement device 1c has a placement unit 4 for aligning and placing the solder balls onto the substrate 7, i.e., the base unit.

Figure 18:
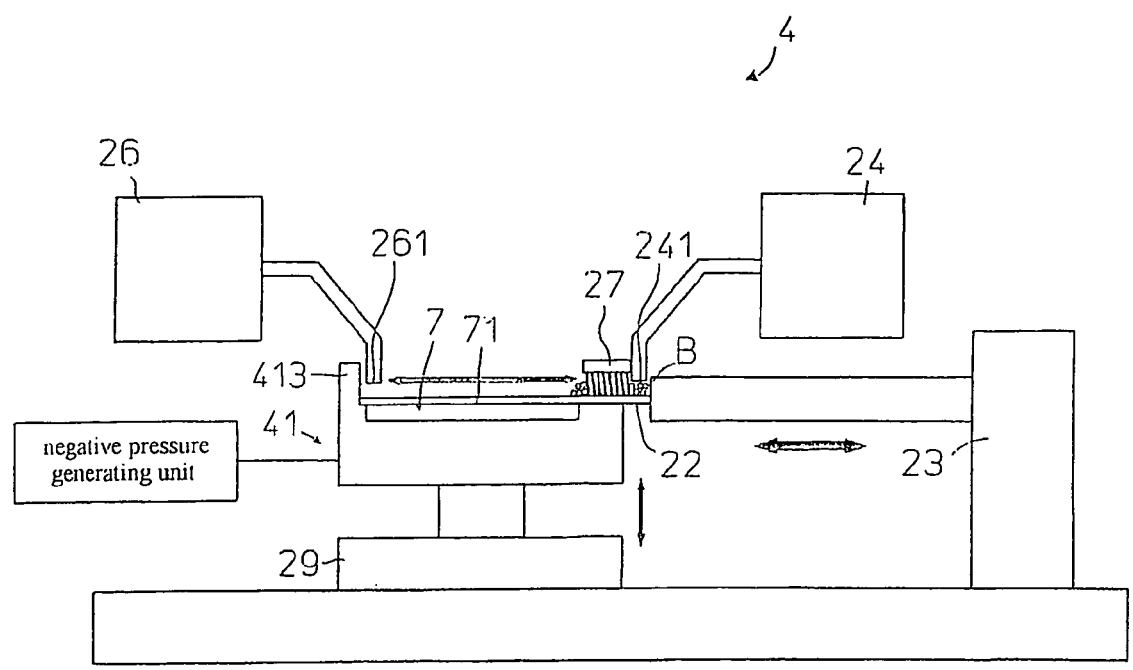
FIG. 18 is a side view of the placement unit of the placement apparatus of the third embodiment.

As shown in FIG. 18, the placement unit 4 of the third embodiment and the placement 2 of the first embodiment are basically the same structure. The placement unit 4 comprises a mask 22', a transfer device 27, a holder 41, a holder raising unit 29, a mask horizontal moving unit 23, a ball supplying unit 24 and a ball removing unit 26. The mask 22' is an arrangement member for arranging the solder balls B onto the electrodes 71 of the substrate 7. The transfer device 27 is horizontally moved to the upper surface of the mask 22' positioned on the substrate 7 by a moving unit (not shown), so as to transfer the solder balls B. To be suited for automation, the holder 41 keeps the position of the substrate 7 horizontally to make the electrodes 71 to face upwards. The holder raising unit 29 is used for freely raising or lowering the holder 41, so as to position the substrate 7 at the predetermined height. The mask horizontal moving unit 23 supports the mask 22' horizontally, moves the mask 22' along the horizontal direction, and then positions the mask 22' on the substrate 7 that is positioned at the predetermined height. The ball supplying unit 24 is used for supplying the solder balls B onto the mask 22'. The ball removing unit 26 is used for removing the remaining solder balls B from the upper surface of the mask 22'.

For the placement unit 4 of the third embodiment, the difference between that from the placement unit 2 of the first embodiment are described as follows. The mask 22' has a soft magnetic part made of magnetic stainless steel, etc., and a drawing unit is assembled to the holder 41, in which the drawing unit draws the mask 22' from below by a magnetic force to make the lower surface of the mask 22' to be closely attached to the upper surface of the substrate 7. The drawing unit will be described in detail as follows. In addition, the drawing unit is assembled into the holder 41 for the drawing unit be suited for automation, but the drawing unit can be used individually, or assembled into other parts used for loading the substrate 7.

3-1 Attraction Unit

As shown in FIG. 19(a), the drawing unit of the present embodiment is a magnetism generator 411 built in the holder 41 for generating a magnetic force. The magnetism generator 411 is arranged having the substrate 7 in between the mask 22 and the magnetism generator 411 and having the mask 22' positioned above the substrate 7. A power supply control circuit 412 is connected to the magnetism generator 411 for supplying power to the magnetism generator 411.

An electrostatic force generator 413 as shown in FIG. 19(b) can be selected as the drawing unit. Similar to the aforementioned magnetism generator 411, the electrostatic force generator 413 is also assembled into the holder 41. A voltage control circuit for applying a voltage is connected to the electrostatic force generator 413. The electrostatic force generator 413 where a positive or a negative polarity will be applied by the voltage control circuit will charge the mask 22' to a polarity opposite to the impressed polarity, and then the make 22' is drawn from below, so as to be closely attached to the substrate 7. In this case, the mask 22' does not require containing the soft magnetic part. The base substance of the mask 22' is preferred to select materials that are easily to be charged. For example, the base substance can be insulating materials having a dielectric constant higher than 4 to 12 and a conductivity with an electric impedance of about $10^8$ to $10^{12}$ $\Omega$cm. Specifically, the base substance can be selected from polyimide resin, phenol resin, silicon resin, polyvinyl chloride resin, ABS resin, acetylcellulose, acetylbutylcellulose, urethane elastomer, chloroprene rubber, di-tolyl rubber, and their mixture, or a combination of suitable carbon black and the above material.

Figure 19:
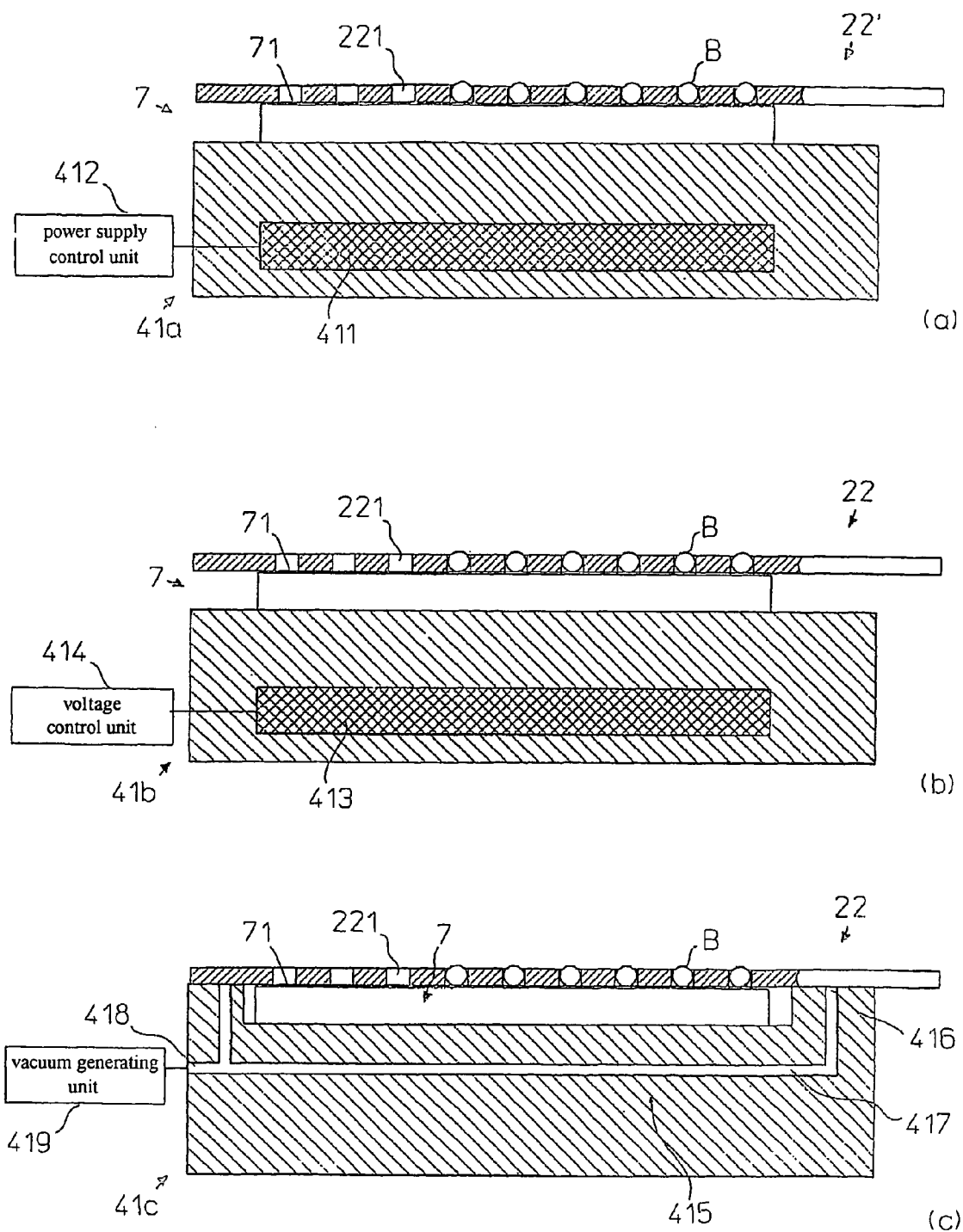
FIG. 19 is a cross-sectional view of the holder in FIG. 18.

A vacuum suction unit 415 as shown in FIG. 19(*c*) can be also selected as the drawing unit. The vacuum suction unit 415 comprises an upper opening 416, a side opening 418, a fluid passage 417 and a vacuum generating unit. The upper opening 416 is opened to the upper surface of the holder 41 where the substrate 7 is not loaded thereon. The side opening 418 is opened to the sidewall. The fluid passage 417 connects the upper opening 416 and the side opening 418, and the fluid passage 417 is formed in the holder 41*c*.The vacuum generating unit is connected to the side opening 418. According to the vacuum suction unit 415, a negative pressure is generated by the vacuum generating unit, the mask 22 loaded on the holder 41 is drawn in the downward direction at the upper opening 416, so as to be closely attached on the substrate 7. In this case, the mask 22' also does not require the soft magnetic part, and various materials can be selected as the base substance of the mask 22'.

3-2 Operation of Placement Device 1*c*

The operation of the placement device 1*c* of the third embodiment is described below.

1) Step for Positioning the Mask (The First Step)

The mask 22' is positioned to the substrate 7.

2) Step for Attracting the Mask

Figure 20:
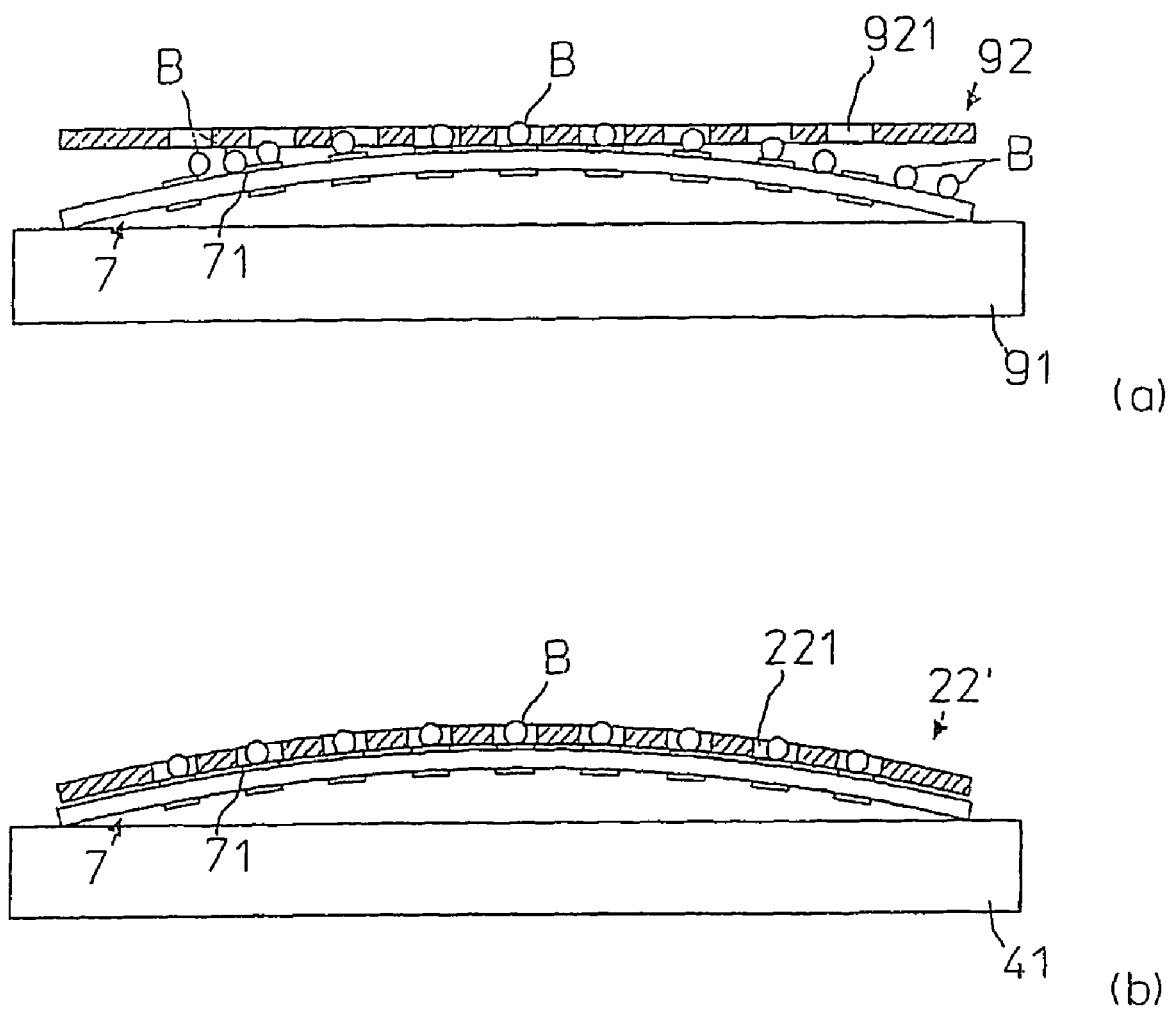
FIG. 20 is an enlarged side view of the holder, the substrate and the mask in FIG. 18.

As shown in FIG. 20(*b*), the mask 22' loaded above the substrate 7 is wholly pulled downwards by the magnetic force generated by the magnetism generator 411 that is powered by the power supply control circuit. As a result, the lower surface of the mask 22' duplicates the upper surface of the substrate 7, and the mask 22' is closely and uniformly attached to the substrate 7. Therefore, even though the substrate 7 is deformed, a large gap will not occur between the substrate 7 and the mask 22'.

3) Step for Placing the Solder Balls (The Second Step)

The solder balls B, wherein the number of the solder balls B is larger than the number of the electrodes 71, are supplied to the upper surface of the mask 22' by using the ball supplying unit 24. The transfer device 27 is arranged in a manner that the line members 271 are substantially in a horizontal position to be in contact with the solder balls B supplied to the upper surface of the mask 22', and then the transfer device 27 is horizontally moved with respect to the upper surface of the mask 22'. The solder balls B are moved by the transfer device 27, and then loaded into the positioning openings 221. The mask 22' is in close contact with the substrate 7. Therefore, the solder balls B placed on the electrodes 71 through the positioning openings 221 will not escape from the positioning openings.

4) Step for Removing the Mask from the Substrate

The holder raising unit 29 is lowered, and then the mask 22' is removed from the substrate 7.

4. Fourth Embodiment

Figure 21:
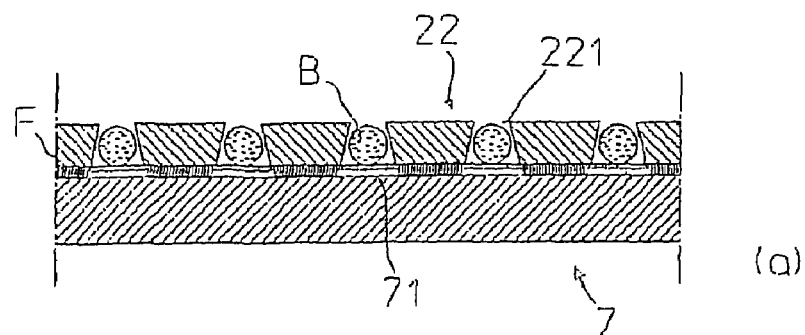
FIG. 21 is a partially enlarged cross-sectional view of the mask, the substrate and the temporal fixing film according to the fourth embodiment.
Figure 21:
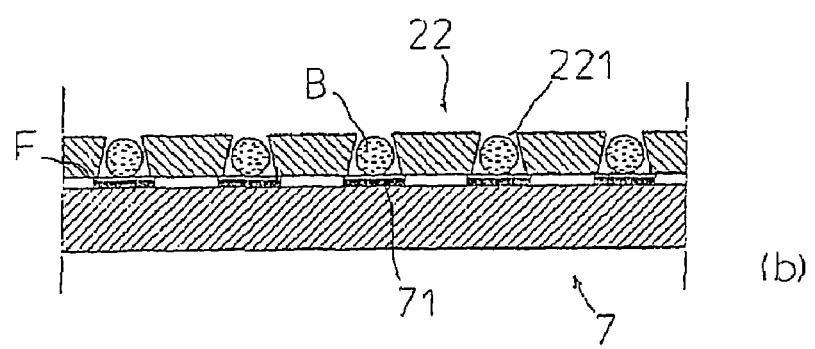
Figure 22:
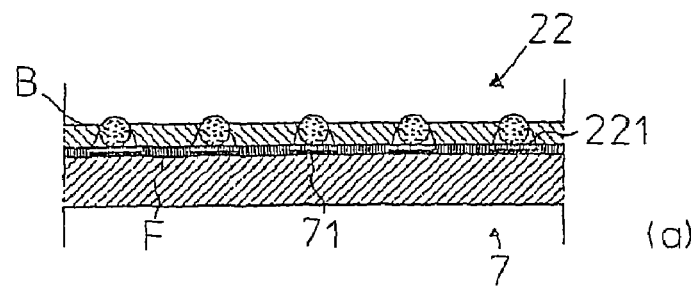
FIG. 22 is diagram for describing the operation of the placement apparatus of the fourth embodiment of FIG. 1.
Figure 22:
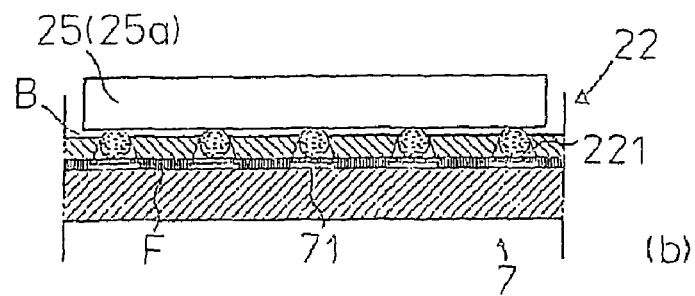
Figure 23:
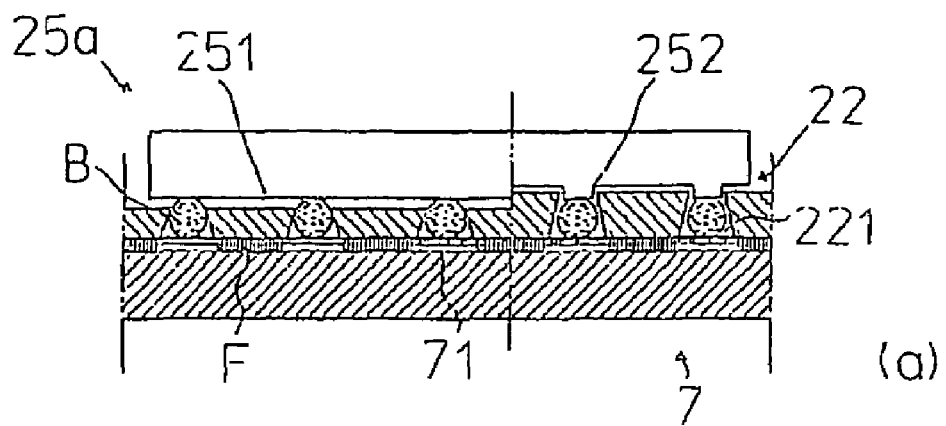
FIG. 23 is a diagram showing a variation example of the temporal fixing film deteriorating unit in FIG. 22.
Figure 23:
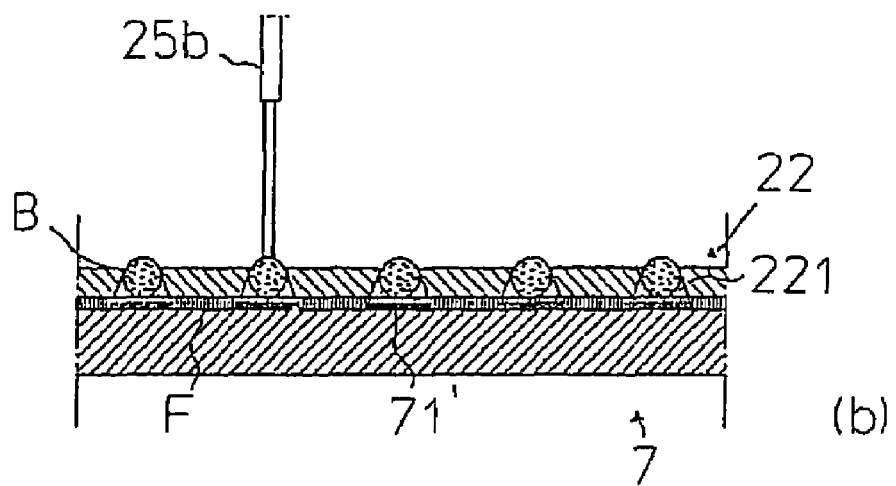
Figure 23:
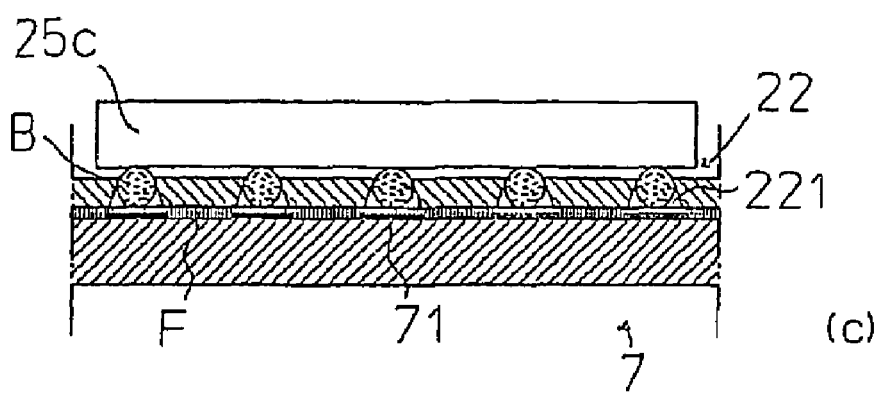

The fourth embodiment of the present invention is described with reference to FIGS. 21 to 23. In addition, the placement device 1*d* of the fourth embodiment and the placement device 1*a* of the first embodiment are basically the same.

For the placement device Id of the fourth embodiment, the differences between that from the placement device 1*a* of the first embodiment are as follows. As shown in FIG. 21(*a*), a substrate 7 with electrodes 71 where at least a temporal fixing film F with a low adhesive force is formed thereon is prepared, the solder balls B are placed on the electrodes 71 through the temporal fixing film F, the adhesive strength of the temporal fixing film F is increased by a deterioration portion of temporal fixing film, and then the solder balls B are temporally secured onto the electrodes 71 by the adhesive strength of the temporal fixing film F. In addition, the temporal fixing film F can be formed to cover the entire upper surface of the substrate 7 as shown in FIG. 21(*a*), or can be selectively formed on the upper surface of the electrodes 71. Next, the temporal fixing film and the temporal fixing film deteriorating unit are described in details.

4-1 Temporal Fixing Film

Figure 13:
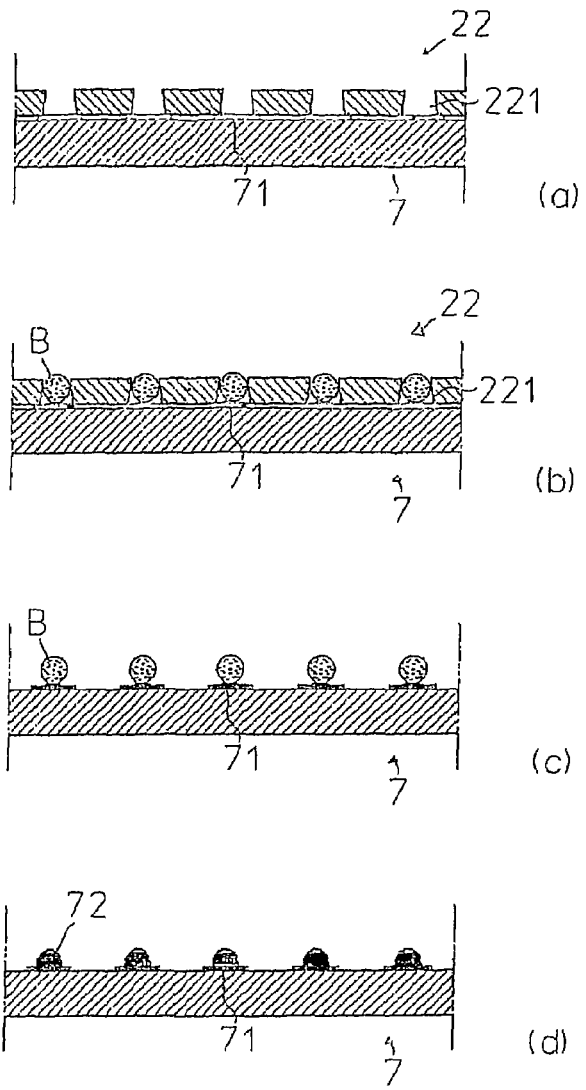
FIG. 13 is a diagram for describing the operation of the placement apparatus of the first embodiment.

The temporal fixing film F temporally secures the solder balls B onto the electrodes 71 in a manner that the solder balls B are not simply moved even though a little external force acts on the solder balls B placed on the substrate 7 after the step for removing the mask described in FIG. 13. However, from the first step for positioning the mask 22 on the substrate 7 to the second step for placing the solder balls B, a low adhesive strength for the temporal fixing film is desired so that the temporal fixing film F is not adhered to the mask 22 or the solder balls B.

The temporal fixing film F can be selected from a material that is solidified at a certain condition to reduce its adhesive strength, and is liquefied (gelation or pasting) at another condition to increase its adhesive strength. For example, organic materials such as paper or resin selected from any one of polypropylene, polyvinyl chloride, polystyrene, polyamide, acetylcellulose and polyester, or metal materials such as Hg, Ga, In, Sn, etc., can be selected as the main material of the selected first type temporal fixing film. According to the first type temporal fixing film, for example, a temporal fixing material is vaporized to form a film on the substrate so as to form the temporal fixing film F with low adhesiveness. Alternatively, the temporal fixing film F with low adhesiveness can also be formed in the following way: mixing a temporal fixing material with a proper solvent (water, oil, or various alcohol or methanol); coating the mixture on the substrate 7; and then removing the solvent by drying. In addition, it is more desirable for the temporal fixing film F formed by the above methods that the surface in contact with the solder balls B is solidified to reduce its adhesive strength.

Liquid, such as water, oil, etc., or various organic solvents, such as alcohol methanol, etc., or liquid mixture including the above liquid as the solvent, can be selected as the selected second type temporal fixing material. According to the second type temporal fixing material, if the temperature of the temporal fixing material is below its melt point, the temporal fixing material is solidified to form the temporal fixing film F with low adhesiveness. It is more desirable for the temporal fixing film F formed by the above methods that the surface in contact with the solder balls B is solidified to reduce its adhesive strength.

If materials, which have a melting point equal to or larger than −100° C. at atmospheric pressure and preferably within a range of room temperature (−10° C. to 50° C.), are selected as the second type temporal fixing material, the process for solidifying the temporal fixing material can be implemented at a low cost. In addition, if materials, which have a boiling point less than the melting point of the solder balls B, such as dodecyl alcohol (melt point: 24° C., boiling point: 154° C.), tetradecanol (melting point: 38° C., boiling point: 289° C.) or butyl alcohol (melt point: 25.4° C., boiling point: 83° C.), are selected, the temporal fixing film F is simultaneously gasified when the solder balls B are reflowed to form the connection bumps. Therefore, a clean process is not required for removing the temporal fixing film F.

For avoiding troubles of removing the temporal fixing film F before reflowing the solder balls B, it is preferred that the melting point of the temporal fixing material is lower than that of the solder balls B.

It is preferred that the temporal fixing film material contains a flux component. During the reflowing of the solder balls B, the flux component 1) prevents the solder balls B and the electrodes 71 from oxidation, and 2) is superior in functions of wettability and reduction for cleaning the surfaces of the electrodes 71. The flux component is, for example, rosin or addition with characteristic similar to rosin. According to the temporal fixing film F formed by the temporal fixing material containing the flux component, occurrence of connection failure between the connection bump and the electrode can be suppressed, and voids occurred within the connection bump can also be suppressed.

4-2 Temporal Fixing Film Deteriorating Unit

The temporal fixing film deteriorating unit is used to thermally, mechanically or chemically deteriorate the temporal fixing film F, so as to increase the adhesive strength of the temporal fixing film. In the placement device 1d of the fourth embodiment, the temporal fixing deteriorating unit is assembled into the placement unit 2.

The temporal fixing film deteriorating unit 25a as shown in FIG. 23(a) is arranged to be in contact with the top of the solder balls B filled into the positioning openings 221, in which at lease one surface that is in contact with the solder balls B generates heat. Regarding the temporal fixing film deteriorating unit 25a, for example, not only a plate-shaped heating element is arranged in one surface of a block base substance, but also can be arranged to be freely raised or lowered by a raising unit (such as an air cylinder, etc.) above the mask 22, so that the heating element is opposite to the mask 22.

The temporal fixing film deteriorating unit 25a heats the solder balls B that are in contact with. Through the solder balls B, the heat melts the temporal fixing film F in the vicinity of areas in contact with the solder balls B. Therefore, the temporal fixing film F is melted (i.e., liquefaction) and the adhesive strength of the temporal fixing film is increased.

The configuration of the temporal fixing film deteriorating unit 25a is not limited to that in the drawing, a variety of configuration can be selected. For example, as shown in FIG. 23(a), when the thickness of the mask 22 is thinner than the diameter of the solder ball B, the surface 251 of the temporal fixing film deteriorating unit 25a in contact with the solder balls B can be planar. In addition, when the thickness of the mask 22 is thicker than the diameter of the solder ball B, protrusions 252 corresponding to the positioning openings 221c an be formed to insert into the positioning openings 221.

As shown in FIG. 23(b), a temporal fixing film deteriorating unit 25b that uses an electron beam (such as laser) for respectively heating the solder balls B can be also selected as the temporal fixing film deteriorating unit.

A temporal fixing film deteriorating unit for previously heating the solder balls B before being transported to the positioning openings 221c an be also selected as the temporal fixing film deteriorating unit. If the solder balls B heated by the temporal fixing film deteriorating unit are placed on the electrodes 71, the temporal fixing film F in the vicinity of areas that are in contact with the solder balls B melts, and the adhesive strength of the temporal fixing film F is increased.

A temporal fixing film deteriorating unit for heating areas containing a plurality of solder balls filled in the positioning openings 221c an be also selected as the temporal fixing film deteriorating unit. The temporal fixing film deteriorating unit, for example, can be constructed by such as an infrared heater. In addition, when selecting such temporal fixing film deteriorating unit, the mask is preferably selected to include a base substance having a thermal conductivity lower than the solder ball B, so that the temporal fixing film F under the mask 22 is heated, melted, but not adhered to the mask 22.

As shown in FIG. 23(c), a temporal fixing film deteriorating unit 25c, which is arranged to be in contact with the tops of the solder balls B filled in the positioning openings 221 so as to press the solder balls B with a predetermined pressure, can be also selected as the temporal fixing film deteriorating unit. In addition, instead of pressing the solder balls B by directly contacting the solder balls B, the temporal fixing film deteriorating unit 25c can be also constructed to vibrate the solder balls B. According to the temporal fixing film deteriorating unit 25c, by using the pressing force or the vibrational force propagating through the solder balls B, the adhesive strength of the temporal fixing film F in the vicinity of areas that are in contact with the solder balls B is increased. The temporal fixing film deteriorating unit 25c is effective for increasing the adhesive strength of the temporal fixing film F in which its surface is solidified and the inside is liquid. Namely, the surface part of the temporal fixing film is mechanically destroyed by the pressing force or vibration due to the operation of the temporal fixing film deteriorating unit 25c. Accordingly, the liquid therein leaks out, and the adhesive strength of the temporal fixing film F is increased.

A temporal fixing film deteriorating unit 25c for coating a component to the outer circumference of the solder balls before being transported to the positioning openings 221c an be selected, wherein the component is used for increasing the adhesive strength of the temporal fixing film F selected according to the temporal fixing material forming the temporal fixing film F. According to the temporal fixing film deteriorating unit, the solder balls in which outer circumferences have been coated with the component for increasing the adhesive strength of the temporal fixing film F are placed on the electrodes 71; and thus the adhesive strength of the temporal fixing film F in the vicinity of areas that are in contact with the solder balls B is increased.

4-3 Operation of Placement Device 1d

The operation of the aforementioned placement device 1d is described.

1) Step for Positioning the Mask (The First Step)

As shown in FIG. 22(a), the mask 22 is positioned over the substrate 7 where a lower adhesive temporal fixing film F is formed on the electrodes 71.

2) Step for Placing the Solder Balls (The Second Step)

The solder balls B are supplied to the upper surface of the mask 22. The solder balls supplied to the mask 11 are moved by the transfer device 27 to transfer the solder balls B to the positioning openings 221. The solder balls B are placed onto the electrodes 71 via the temporal fixing film F. In addition, the solder balls B are placed by the transfer device 27 according to the placement device of the fourth embodiment, but can be also placed by a suction mechanism like the placement device of the fifth embodiment, or by other methods.

3) Step for Temporally Fixing the Solder Balls (The Third Step)

As shown in FIG. 22(b), the temporal fixing film deteriorating unit 25a is in contact with the tops of the solder balls that are transferred to the positioning openings 221, so as to heat the solder balls B. The temporal fixing film F in the vicinity of areas that are in contact with the solder balls B is melted by the heat delivered through the solder balls B, and the adhesive strength is increased. The solder balls B are temporally secured by the temporal fixing film F due to the adhesive strength. In addition, it is desired that the temporal fixation of the solder balls B is stronger if the solder balls B are pressurized and vibrated when heating the solder balls B.

The temporal fixing film deteriorating unit 25a is detached from the solder balls B. Afterwards, although the melted temporal fixing film F is cooled and solidified, the solder balls that are once temporally secured by the temporal fixing film F will not be detached by external forces.

5. Fifth Embodiment

The fifth embodiment of the present invention is described with reference to FIGS. 1 and 24-25.

Figure 24:
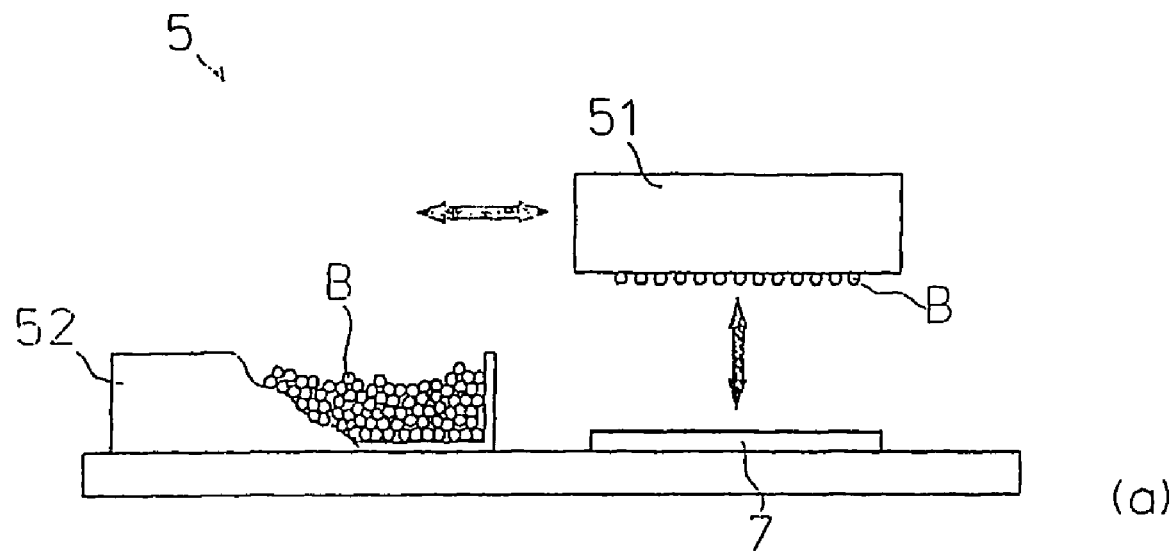
FIG. 24 shows a placement unit of the placement apparatus according to the fifth embodiment of FIG. 1.
Figure 24:
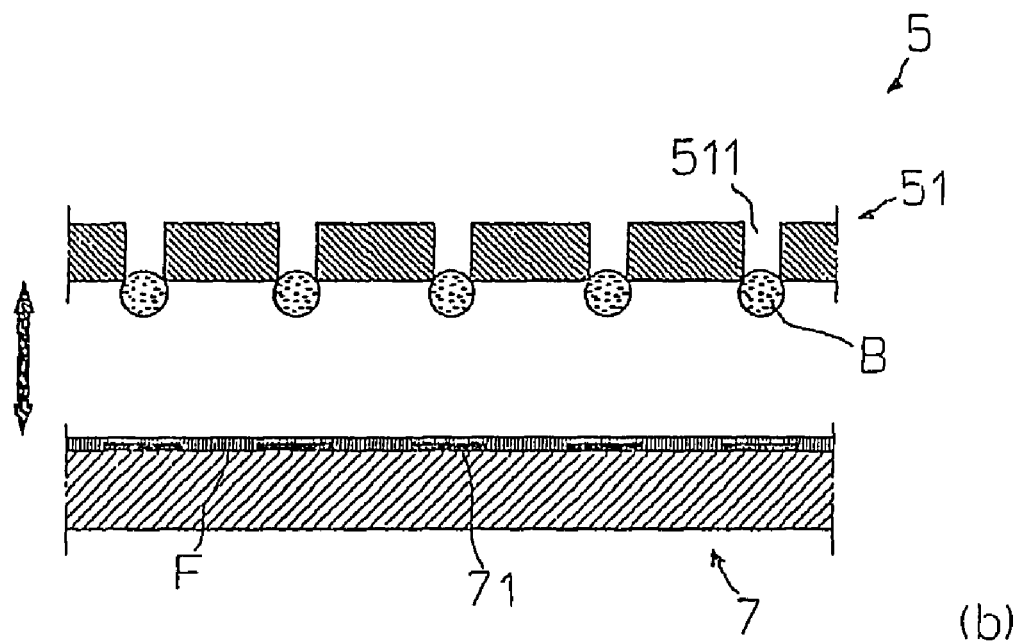

Regarding the placement device 1e of the fifth embodiment, the differences between that from the placement device 1a of the first embodiment are the same as those of the placement device 1d of the fourth embodiment: preparing a substrate having electrodes on which at least a lower adhesive temporal fixing film is formed, having a temporal fixing film deteriorating unit for increasing the adhesive strength of the temporal fixing film, and as shown in FIG. 24, having a suction head 51 as the arrangement member using a suction method. In addition, the temporal fixing film and the temporal fixing film deteriorating unit are basically the same as those of the fourth embodiment, and thus their detail descriptions are omitted.

5-1 Placement Device

As shown in FIG. 1, the placement device 1e has a placement unit 5.

5-2 Placement Unit

As shown in FIG. 24, the placement unit 5 comprises a suction head 51, a container 52 and a temporal fixing film deteriorating unit (not shown). The suction head 51 is an arrangement member, and has a suction unit 511 for detachably positioning the solder balls B according to the pattern of the electrodes 71. The container 52 has an upper opening and is used for receiving a plurality of solder balls B.

The suction head 51 is a culvert body with an internal space. The Throughhole-like positioning suction units 511 corresponding to the pattern of the electrodes 71 are formed on the lower surface of the suction head 51. The positioning suction unit 511 is formed smaller than the diameter of the solder ball B, so as to be able to suck the solder ball B. A negative pressure generating unit (not shown) is connected to the suction head 51. According to the suction head 51, the solder balls B are sucked by the positioning suction units 511 because a negative pressure is generated by the negative pressure generating unit. The solder balls B will be detached from the positioning suction units 511 by turning off the negative pressure. The suction head 51 is constructed to move along an up-and-down, left-and-right or front-and-rear direction with respect to the paper by a moving unit (not shown), so that the solder balls B drawn by the positioning suction units 511 are positioned according to the electrodes 71.

5-3 Operation of Placement Device 1e

The operation of the aforementioned placement device 1e is described.

1) Step for Positioning the Suction Head (The First Step)

The solder balls B received in the container are drawn by the positioning suction unit 511. As shown in FIG. 25(a), the suction head 51 is positioned in a manner that the solder balls B drawn by the positioning suction units 511 are corresponding to the electrodes 71.

2) Step for Placing the Solder Balls (The Second Step)

The solder balls B are separated from the positioning suction units 511, and are placed on the electrodes 71 with the low-adhesive temporal fixing film F.

3) Step for Temporally Fixing the Solder Balls (The Third Step)

Figure 25:
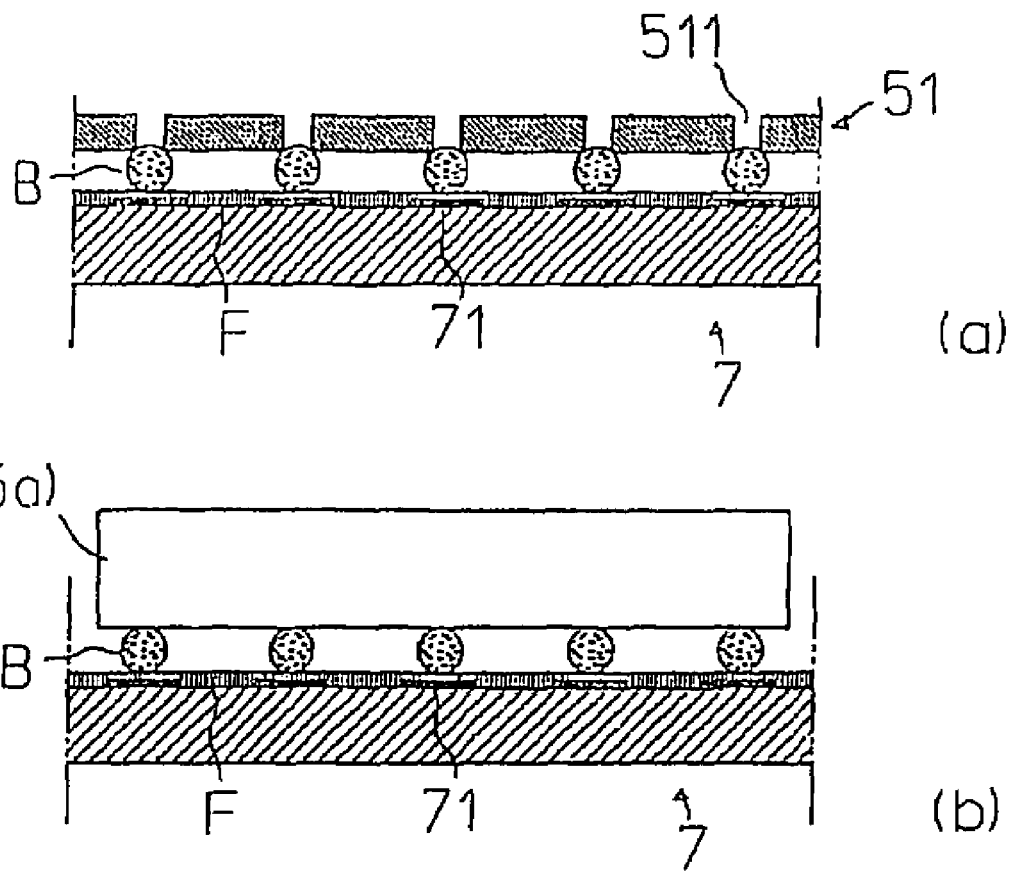
FIG. 25 is a diagram for describing the operation of the placement apparatus according to the fifth embodiment of FIG. 1.

As shown in FIG. 25, the temporal fixing film F is melted by the temporal fixing film deteriorating unit to increase the adhesive strength of the temporal fixing film F, so as to temporally secure the solder balls B.

6. Sixth Embodiment

The sixth embodiment of the present invention is described with reference to FIGS. 26-28.

Figure 26:
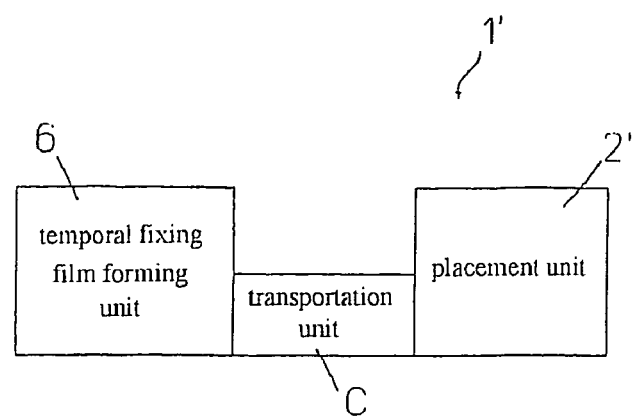
FIG. 26 is a conceptual diagram of a placement apparatus according to the sixth embodiment of the present invention.

As shown in FIG. 26, the placement device 1' comprises a placement unit 2' and a temporal fixing film forming unit 6. The placement unit 2' is basically the same as the placement unit 2 of the placement device 1d of the fourth embodiment, and has a temporal fixing film deteriorating unit 25. The temporal fixing film forming unit 6 is arranged at the upstream side of the placement unit 2. The transportation of the substrate 7 between the temporal fixing film forming unit 6 and the placement unit 2 can be performed manually. Alternatively, a transportation unit C can be set between the temporal fixing film forming unit 6 and the placement unit 2 as shown, to mechanically transport the substrate 7 by using the transportation unit C.

6-1 Temporal Fixing Film Forming Unit

The temporal fixing forming unit 6 is used to form a low-adhesive temporal fixing film F on the electrodes 71. The temporal fixing film F is formed by using the aforementioned temporal fixing material. The method for forming the temporal fixing film F is not particularly limited, but for example, the temporal fixing film F can be formed by using the exemplary temporal fixing film forming unit 6 as shown in FIG. 27.

Figure 27:
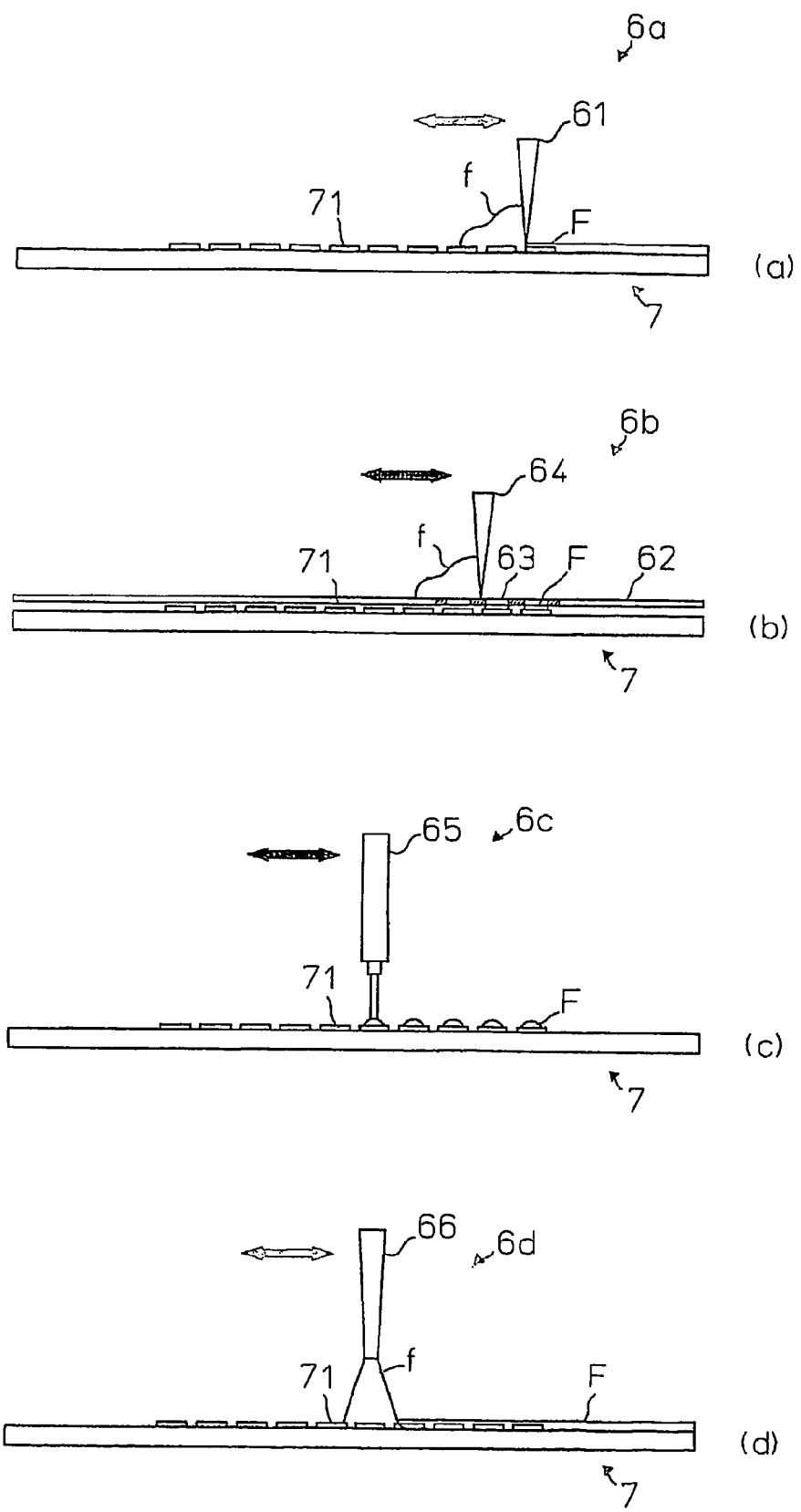
FIG. 27 is a diagram showing a temporal fixing film forming unit of the placement apparatus in FIG. 26.

The temporal fixing film forming unit 6 as shown in FIG. 27 is used to apply and dispose any one of the second types temporal fixing material, i.e., the liquid temporal fixing material in which the original adhesive strength is high, onto the electrodes 71. Then, the disposed temporal fixing material is solidified to form the low adhesive temporal fixing film F.

The temporal fixing film forming unit 6a shown in FIG. 27(a) comprises a dispensing unit 61 capable of moving laterally over the upper surface to be in contact with the front end. According to the temporal fixing film forming unit 6a, a paste-like temporal fixing material f is supplied to the upper surface of the substrate 7, and the supplied temporal fixing material f is spread by the dispensing unit 61. At this time, the temporal fixing material f has to be uniformly spread and coated as thin as possible. The applied temporal fixing material f is heated or cooled to solidify. As a result, the low-adhesive temporal fixing film F is formed.

The temporal fixing film forming unit 6b shown in FIG. 27(*b*) comprises a Printing mask 62 having throughholes 63 corresponding to the electrodes 71, and a dispenser 61 capable of moving laterally over the upper surface to be in contact with the front end. According to the temporal fixing film forming unit 6b, the printing mask 62 is positioned so that the throughholes 63 correspond to the electrodes 71, and the paste-like temporal fixing material F is supplied to the upper surface of the mask 62. The temporal fixing material f that is supplied to the upper surface is spread and coated by the dispensing unit 61, so as to print selectively the temporal fixing material onto the electrodes 71. The printed temporal fixing material f is heated or cooled to solidify. As a result, the low-adhesive temporal fixing film F is formed on the electrodes 71.

The temporal fixing film forming unit 6c shown in FIG. 27(*c*) comprises a Syringe applying unit 65 for applying the paste-like temporal fixing material f from its lower end. The applying unit 65 is constructed to be able to move above the substrate 7 along the front-and-rear/left-and-right/up-and-down direction with respect to the paper, and to be positioned with respect to the electrodes 71. According to the temporal fixing film forming unit 6c, the applying unit 65 is positioned over the electrodes 71, and then the temporal fixing material f is injected and applied onto the electrodes 71. The applied temporal fixing material f is heated or cooled to solidify. As a result, the low-adhesive temporal fixing film F is formed on the electrodes 71.

The temporal fixing film forming unit 6d shown in FIG. 27(*d*) comprises an applying unit 66 for injecting the liquid temporal fixing material f from its lower end. The applying unit 66 is constructed to be able to move above the substrate 7 along the front-and-rear/left-and-right/ up-and-down direction with respect to the paper. According to the temporal fixing film forming unit 6d, the applying unit 66 moves laterally along the front-and-rear or left-and-right direction above the substrate 7, so as to inject and apply the temporal fixing material 6a on the entire substrate 7. The applied temporal fixing material f is heated or cooled to solidify. As a result, the low-adhesive temporal fixing film F is formed on the electrodes 71.

6-2 Operation of Placement Device 1'

The operation of the above placement device 1' is described.

1) Step for Forming the Temporal Fixing Film

Figure 28:
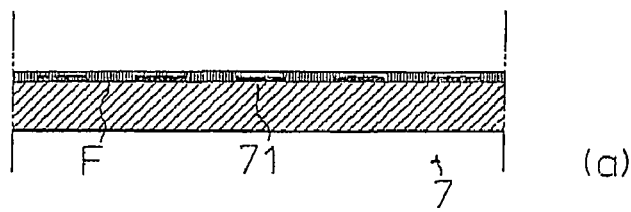
FIG. 28 is a diagram for describing the operation of the placement apparatus in FIG. 26.
Figure 28:
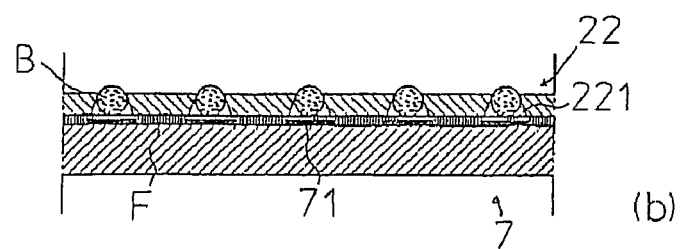
Figure 28:
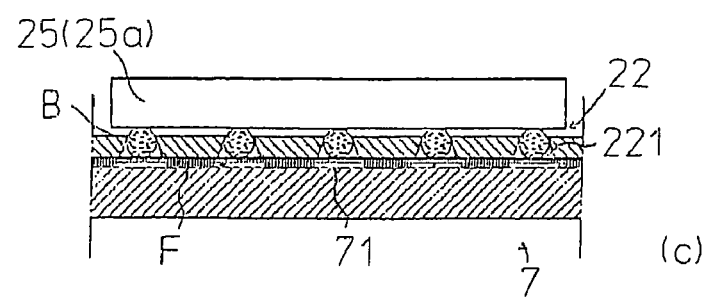

High adhesive and liquid temporal fixing material is thinly applied and disposed on the substrate 7, the disposed temporal fixing material is solidified, and a low-adhesive temporal fixing film F is formed on the electrodes 71 as shown in FIG. 28(*a*).

2) Step for Positioning the Mask (The First Step)

As shown in FIG. 28(*b*), the mask 22 is positioned above the substrate 7, so that the electrodes 71 correspond to the positioning openings 221.

3) Step for Placing the Solder Balls (The Second Step)

The solder balls B are supplied to the upper surface of the mask 22. The solder balls B are moved by the transfer device 27 and then transported to the positioning openings 221. The solder balls B is further placed on the electrodes 71 via the temporal fixing film F.

4) Step for Temporally Fixing the Solder Balls (The Third Step)

As shown in FIG. 28(*c*), the temporal fixing film F is melted by the temporal fixing film deteriorating unit 25a, so as to recover the adhesive strength of the temporal fixing film F and thus to temporally secure the solder balls B.

6-3 EXAMPLES

Examples of the fourth and the sixth embodiments are described.

1) Example 1

The example is described by using the generally-used paste-like rosin flux as the temporal fixing material. In addition, resin or water soluble materials can be also used as the flux.

As shown in FIG. 27(*a*), the temporal fixing material f is applied with a thickness of about several micrometers (μm) to several ten micrometers (μm). The temporal fixing material is heated by 120° C. warm air for 30 seconds, the solvent component of the temporal fixing material f is evaporated. The surface of the temporal fixing material f is dried in a manner that the temporal fixing material f is not adhered on the mask 22 or the solder balls B, and then a low-adhesive temporal fixing film F is formed.

As shown in FIG. 28(*b*), the mask 22 is positioned so that the positioning openings 221 correspond to the electrodes 71, and the solder balls are transferred into the openings 221. The temporal fixing film deteriorating unit 25a will create heat with a temperature equal to or larger than the melting point of the temporal fixing material (60 to 90° C.). As shown in FIG. 28(*c*), the temporal fixing film deteriorating unit 25a is instantly in contact with the solder balls B to melt the temporal fixing film F, so that the solder balls B are temporally secured.

2) Example 2

The example is described by using liquid rosin flux diluted by high volatile IPA as the temporal fixing material f.

Similar to the example 1, the temporal fixing film F is formed. According to the temporal fixing material f, the temporal fixing material f is dried more quickly since the IPA is highly volatile, and thus the temporal fixing film F can be effectively formed. In addition, since IPA evaporates and disappears, the thickness of the temporal fixing film F can be controlled by the IPA ratio in the temporal fixing material. For example, when a thin temporal fixing film F is required, the IPA ratio can be increased.

Thereafter, the solder balls are temporally fixed as described in example 1.

3) Example 3

The example is described using dodecyl alcohol with a melting point of 24° C. as the solvent and using the diluted rosin flux as the temporal fixing material. Butyl alcohol (melt point:25° C.) and tetra decyl alcohol (melt point:38° C.), etc. can be also used as the solvent.

Similar to the example 1, the above temporal fixing material f is applied to the electrodes 71. The temporal fixing material is cooled, and then the temporal fixing film is formed. When the temporal fixing material comprise only the flux, since its melt point is −40° C. lower than the room temperature, it is difficult to cool and solidify using general cooling methods. However, according to the above temporal fixing material f, since the temporal fixing material f is diluted by the dodecyl alcohol that is solidified at 24° C., the dodecyl alcohol is solidified in a manner that the flux is contained inside if the temporal fixing material is cooled below the melting point of the dodecyl alcohol. Thus, a low-adhesive temporal fixing film is formed.

The cooling process continues to maintain the adhesive strength of the temporal fixing film F. In addition, similar to the example 1, the solder balls B are transferred to the positioning openings 221, and the temporal fixing film deteriorating unit 25a generates heat to a temperature higher than the melting point of the temporal fixing material f and is instantly in contact with the solder balls B, so that the temporal fixing film F is melted and the solder ball B are temporally secured.

4) Example 4

The example is described using the above dodecyl alcohol as the temporal fixing material f.

The temporal fixing material f is applied to the surface of the substrate 7 by the applying unit 66 shown in FIG. 27(d), and the temporal fixing material f is cooled below its melting point to form the temporal fixing film F. According to the temporal fixing material, since its melting point is within the range of room temperature, it is advantageous that the solidification (namely, to maintain the cooling) can be easily maintained.

Thereafter, similar to the example 3, the solder balls B are temporally secured.

In any one of the examples 1-4, the mask 22 can be removed by using the temporal fixing film F without adhering to the substrate 7. The temporal fixing film F adhered to the removed mask 22 or the positioning openings 221 is precluded. The temporal fixing film F is also not adhered on the solder balls B, so that the next process can be performed without a cleaning process.

INDUSTRIAL USABILITY

The present invention is not limited to the above descriptions. For example, in fields of the medicine or the ceramic industry, etc., the present invention can be applied to place tiny or uncertain shape powders and particles onto a substrate.

What is claimed is:

1. An apparatus for placing balls having conductivity in a predetermined pattern onto one surface of a base unit, comprising:
an arrangement member, having one surface, another surface opposite to the one surface and positioning openings, wherein the positioning openings are arranged corresponding to a pattern such that the openings are through from the one surface to the another surface of the arrangement member so that the balls are inserted therein; and
a transfer device, having two or more flexible line members in which core axes thereof are substantially aligned, wherein each of the line members comprises a first end and a second end that are held by a pair of holding members, and an abdomen, which is a portion of each of the line members in between the first end and the second end, wherein
at least when the balls are placed,
the arrangement member is positioned in a manner that the another surface of the arrangement member is opposite to the one surface of the base unit, and
the line members of the transfer device are arranged in a substantially horizontal manner for only the abdomens of the line members of the transfer device to contact with the one surface of the arrangement member and the balls supplied to the one surface of the arrangement member, and the transfer device is moved horizontally with respect to the one surface of the arrangement member.

2. The apparatus of claim 1, wherein the core axes of the line members are intersected with a moving direction of the transfer device at an angle of 45 to 135 degrees.

3. The apparatus of claim 1, wherein the line members have an elastic property, and the line members are positioned in a manner to be pressed to the one surface of the arrangement member.

4. The apparatus of claim 1 comprising a magnetism generator arranged with respect to the base unit, and wherein at least portions of the line members relative to the magnetism generator are soft magnetic.

5. The apparatus of claim 4, wherein the magnetism generating unit has a plurality of magnetic areas, the adjacent magnetic areas are arranged with different polarities, and at least portions of the line members relative to the magnetism generator are soft magnetic.

6. The apparatus of claim 4, wherein the magnetism generating unit has a plurality of magnetic areas, adjacent magnetic areas are arranged with different polarities, the magnetic areas are arranged in one row, and at least portions of the line members relative to the magnetism generator are soft magnetic.

7. The apparatus of claim 1, wherein for the arrangement member, when the another surface of the arrangement member is positioned to be opposite to the one surface of the base unit, a distance t from the one surface of the base unit to the one surface of the arrangement member with respect to a diameter d of the ball has a thickness of $0.8 \leq t/d \leq 1.4$, and the positioning opening has a first taper hole getting wider from the one surface to the another surface, a crest line at the one surface side of the first taper hole is higher than the one surface side from a center of the ball placed on the one surface of the base unit.

8. The apparatus of claim 7, wherein the first taper hole is a substantially frustum shape.

9. The apparatus of claim 7, wherein the positioning opening has a second taper hole coaxial with the first taper hole, and is formed at the one surface side of the arrangement member, and is getting wider along a direction from the another surface to the one surface.

10. The apparatus of claim 7, wherein the positioning opening has a second taper hole coaxial with the first taper hole, and is formed at the one surface side of the arrangement member, and is getting wider along a direction from the another surface to the one surface, and the first and the second taper holes are substantially a frustum shape.

11. The apparatus of claim 1, comprising a drawing unit for drawing the arrangement member, wherein the drawing unit is arranged having the base unit in between the drawing unit and the arrangement member for the another surface of the arrangement member be positioned to the one surface of the base unit.

12. The apparatus of claim 11, wherein the drawing unit is a magnetism generator, and the arrangement member comprises a soft magnetic portion.

13. The apparatus of claim 11, wherein the drawing unit is a magnetism generator.

14. The apparatus of claim 1, comprising: the base unit having a low-adhesive temporal fixing film formed on the one surface; and a temporal fixing film deteriorating unit for increasing an adhesive strength of the temporal fixing film.

15. The apparatus of claim 1, comprising: a temporal fixing film forming unit for forming a low-adhesive temporal fixing film on the one surface of the base unit; arid a temporal fixing film deteriorating unit for increasing an adhesive strength of the temporal fixing film.

* * * * *